US012801801B2

(12) United States Patent
Kuriyama et al.

(10) Patent No.: US 12,801,801 B2
(45) Date of Patent: Nov. 17, 2026

(54) ASSISTANCE TOOL

(71) Applicant: DENSO CREATE INC., Nagoya (JP)

(72) Inventors: Junji Kuriyama, Nagoya (JP); Atsushi Yamaji, Nagoya (JP); Takashi Nishimura, Nagoya (JP); Yoshihiro Ito, Nagoya (JP); Kenzo Hara, Nagoya (JP)

(73) Assignee: DENSO CREATE INC., Nagoya (JP)

( * ) Notice: Subject to any disclaimer, the term of this patent is extended or adjusted under 35 U.S.C. 154(b) by 1101 days.

(21) Appl. No.: 17/700,128

(22) Filed: Mar. 21, 2022

(65) Prior Publication Data

US 2022/0284149 A1 Sep. 8, 2022

Related U.S. Application Data

(63) Continuation of application No. PCT/JP2020/033075, filed on Sep. 1, 2020.

(30) Foreign Application Priority Data

Sep. 23, 2019 (JP) ................................ 2019-172387

(51) Int. Cl.
*G06F 30/15* (2020.01)
*G06F 30/12* (2020.01)
*G06F 30/20* (2020.01)

(52) U.S. Cl.
CPC .............. *G06F 30/15* (2020.01); *G06F 30/12* (2020.01); *G06F 30/20* (2020.01)

(58) Field of Classification Search
CPC .......... G06F 30/15; G06F 30/12; G06F 30/00; G06F 30/17; G06F 30/18; G06F 8/355;
(Continued)

(56) References Cited

U.S. PATENT DOCUMENTS 6,591,278 B1 * 7/2003 Ernst ........................ G06F 16/25
10,999,290 B2 * 5/2021 Spurlock ................. G06F 21/10
(Continued)

FOREIGN PATENT DOCUMENTS

JP H06274335 A 9/1994
JP H11102291 A 4/1999
(Continued)

OTHER PUBLICATIONS

Haidrar, Saida, et al. "REQDL: A requirements description language to support requirements traces generation." 2017 IEEE 25th International Requirements Engineering Conference Workshops (REW). IEEE, 2017. (Year: 2017).*
(Continued)

*Primary Examiner* — Michael Edward Cocchi
(74) *Attorney, Agent, or Firm* — Harness, Dickey & Pierce, P.L.C.

(57) ABSTRACT

A design assistance tool: defines a metamodel using one or more metaclass in each of at least two processes and performs a design of each process using the corresponding metamodel; defines a relationship between one metaclass included in one process and one metaclass included in another process as a possession relationship or a reference relationship; displays a design result based on the metamodels as a view on a display; and, in response to an occurrence of an inconsistency in the possession relationship or the reference relationship between the one metaclass included in one process and the one metaclass included in another process due to creation, modification, or deletion of one metaclass in any one of the at least two processes, allows the inconsistency and displays the inconsistency on the view of the display.

8 Claims, 27 Drawing Sheets

(58) Field of Classification Search
CPC . G06F 11/323; G06F 8/34; G06F 8/38; G06F 8/35; G06F 8/20; G06F 30/20; G06F 30/25; G06F 30/27; G06F 30/28
See application file for complete search history.

(56) References Cited

U.S. PATENT DOCUMENTS

| | | | | |
|---|---|---|---|---|
| 2003/0046550 | A1* | 3/2003 | Carroll | H04L 63/102 713/185 |
| 2008/0319999 | A1* | 12/2008 | Simpson | H04L 63/10 707/999.009 |
| 2009/0144695 | A1* | 6/2009 | Vairavan | G06F 11/3604 717/105 |
| 2009/0187889 | A1 | 7/2009 | Kuester et al. | |
| 2010/0162208 | A1 | 6/2010 | Amid et al. | |
| 2012/0198415 | A1* | 8/2012 | Brandt | G06F 8/73 717/104 |
| 2013/0305223 | A1 | 11/2013 | Eade et al. | |
| 2017/0295197 | A1* | 10/2017 | Parimi | G06N 20/00 |
| 2019/0079797 | A1 | 3/2019 | Hori et al. | |
| 2021/0136077 | A1* | 5/2021 | Kemme | H04L 63/108 |
| 2021/0250362 | A1* | 8/2021 | Spurlock | H04L 63/1416 |

FOREIGN PATENT DOCUMENTS

| | | | |
|---|---|---|---|
| JP | 2006338303 | A | 12/2006 |
| JP | 2013077177 | A | 4/2013 |
| JP | 2018005315 | A | 1/2018 |
| JP | 2019053355 | A | 4/2019 |

OTHER PUBLICATIONS

U.S. Appl. No. 17/700,288, filed Mar. 21, 2022, Kuriyama et al.

U.S. Appl. No. 17/700,332, filed Mar. 21, 2022, Kuriyama et al.

A. Radjenovic et al: "The Role of Dependency Links in Ensuring Architectural View Consistency", Software Architecture, WICSA 2008. Seventh Working IEEE/IFIP Conference, Feb. 18, 2008 (Feb. 18, 2008), pp. 199-208, XP031234346, DOI: 10.1109/WICSA.2008.30 ISBN: 9780769530925.

H Dubois et al: "A Model for Requirements Traceability in a Heterogeneous Model-Based Design Process: Application to Automotive Embedded Systems", Engineering of Complex Computer Systems (ICECCS), 2010 15th IEEE International Conference, Mar. 22, 2010 (Mar. 22, 2010), pp. 233-242, XP031795516, DOI: 10.1109/ICECCS.2010.2 ISBN: 9781424466382.

* cited by examiner

FIG. 16

230

INPUT 231

| NO. | Name | Type | Description |
|---|---|---|---|
| 1. | C.C. state | State | Current C.C. state |
| 2. | Vehicle speed | double | Current vehicle speed |
| 3. | Presence and absence of preceding vehicle | bool | The value is "True" if a preceding car exists (detected). The value is "False" if it does not exist (not detected). |
| 4. | Distance between the actual vehicles | double | Inter-vehicular distance measured by sensor |
| 5. | Inter-vehicular distance setting | State | Setting of inter-vehicular distance set by the drivers(short, middle, long) |

OUTPUT 232

| NO. | Name | Type | Description |
|---|---|---|---|
| 1. | Difference of inter-vehicular distance | double | Difference between actual vehicle distance and target inter-vehicular distance |

INTERNAL DATA 233

| NO. | Name | Variable name | Data Type | Dynamics | Description |
|---|---|---|---|---|---|
| 1. | Target vehicle speed | Target Speed | double | Fixed | Target vehicle speed that is input to C.C. |
| 2. | Current vehicle speed | Current Speed | double | Dynamic | Current vehicle speed |

FIG. 19

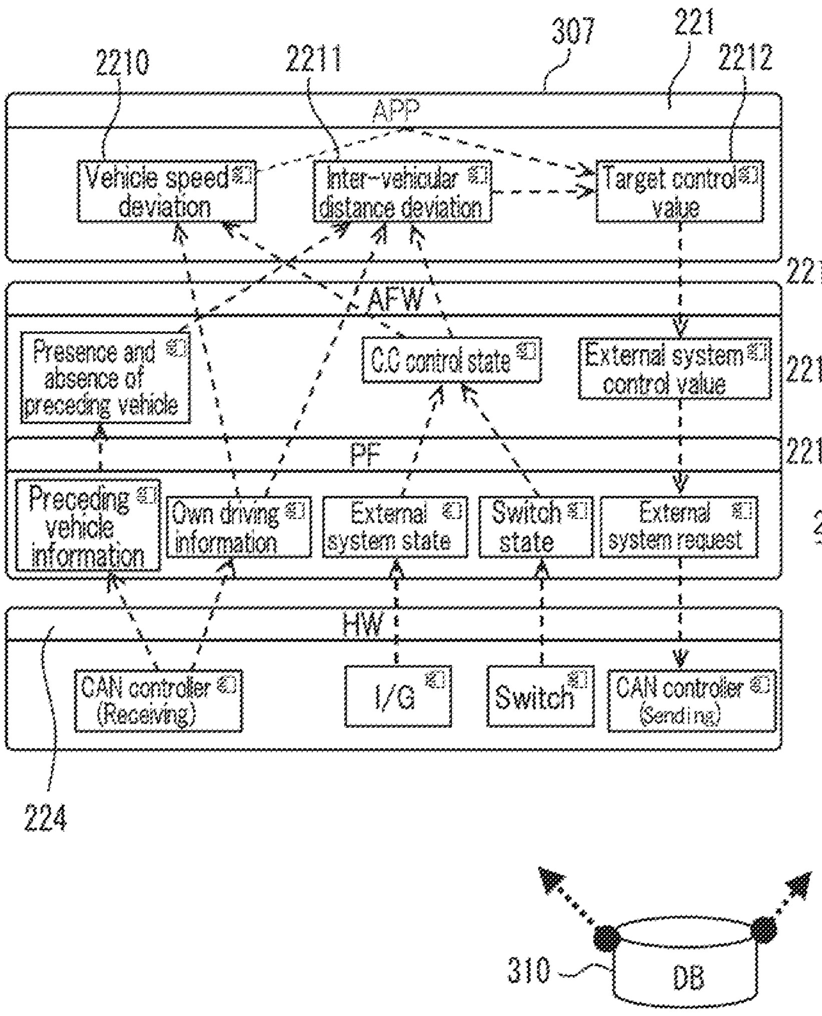

1. Layer APP 221

Responsibility

Realize the service for users
In this system, the target control amount (acceleration/deceleration) is calculated from the difference between the speed and the inter-vehicular distance.

Component 2202

| No. | Name | Responsibility |
|---|---|---|
| 1. | Inter-vehicular distance deviation (2211) | Calculate target inter-vehicular distance from distance setting and actual vehicle speed<br>Output the difference between the actual inter-vehicular distance and the target inter-vehicular distance |
| 2. | Target control value (2212) | Acceleration and deceleration for approaching the target value are calculated from the difference between the vehicle speed and the difference of the distance between the vehicles. |
| 3. | Vehicle speed deviation (2210) | Calculate the target vehicle speed from driver's request.<br>Calculate the difference between the actual vehicle speed and the target vehicle speed. |

2. Layer AFW 222

Responsibility

This has roles such as "combine the information that is commonly used by APP layer on the basis of the information of PF layer, and to distribute the request calculated by APP layer to the parts of PF layer" and "Distributes the request calculated by APP layer to parts of PF layer". Components that are expected to change due to vehicle deployment are located in this layer.

This system realizes the following responsibilities.
- Collect information from the outside and determine the state of C.C. function
- Allocate the deceleration amount to the external system

▽Component

| No. | Name | Responsibility |
|---|---|---|
| 1. | External system control value | It is responsible for distributing the target control amount to the engine and the brakes respectively.<br>Elements that vary depending on vehicle type, such as vehicle weight and engine characteristics, are integrated into this component. |
| 2. | C.C. control state | Determine the control status of C.C. from each switch operations of the |

FIG. 21

148 1481 1482 1480

Table: Relation

| | RelationType | SourceId | TargetId | IsDerivation | SourceIndex | TargetIndex | MetamodelId | ParentId | IsProxy | Id | |
|---|---|---|---|---|---|---|---|---|---|---|---|
| | Filter | Filter | Filter | Filter | Filter | Filter | Filter | Filter | Filter | Filter | Filter |
| 1 | Embed | 6964cde2-fcac-4e20-9··· | 2adb8f6e-38c··· | 0 | 0 | -1 | System.Core.··· | *NULL* | 0 | 1562acd9-c0b2-4620-9··· | |
| 2 | Embed | 6964cde2-fcac-4e20-9··· | e597256a-05··· | 0 | 1 | -1 | System.Core.··· | *NULL* | 0 | f2ec53fd-2aa··· | |
| 3 | Embed | 2adb8f6e-38c··· | fe59b896-89··· | 0 | 0 | -1 | System.Desig··· | *NULL* | 0 | a5a614d7-13··· | |
| 4 | Embed | 2adb8f6e-38c··· | 482fb6a0-429··· | 0 | 1 | -1 | System.Desig··· | *NULL* | 0 | ea298320-89··· | |
| 5 | Embed | 2adb8f6e-38c··· | b420d16c-e9c4-4fdb-88··· | 0 | 2 | -1 | System.Desig··· | *NULL* | 0 | 7a9f8512-ee12-4bad-8··· | |
| 6 | Embed | 2adb8f6e-38c··· | 1b61b5ce-9d··· | 0 | 3 | -1 | System.Desig··· | *NULL* | 0 | e07150b7-2f··· | |
| 7 | Embed | 2adb8f6e-38c··· | da24aedc-4d3··· | 0 | 4 | -1 | System.Desig··· | *NULL* | 0 | 17f5ed5a-4d8··· | |
| 8 | Embed | fe59b896-89··· | 2bb12f97-9d5··· | 0 | 0 | -1 | 0503caab-2c··· | *NULL* | 0 | 8cb7e3ec-3b··· | |
| 9 | Embed | fe59b896-89··· | eb909dd0-79··· | 0 | 0 | -1 | b71cb15e-e008-4b69-a··· | *NULL* | 0 | 02d0374d-6d··· | |
| 10 | Embed | 2bb12f97-9d5··· | dd1a2e56-8f5··· | 0 | 0 | -1 | 00edd2d1-ea01-4d22-a··· | *NULL* | 0 | 830f49fc-ed12-48f4-be··· | |

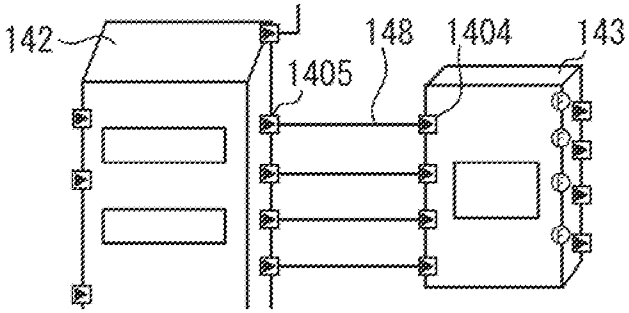

ASSISTANCE TOOL

CROSS REFERENCE TO RELATED APPLICATIONS

The present application is a continuation application of International Patent Application No. PCT/JP2020/033075 filed on Sep. 1, 2020, which designated the U.S. and claims the benefit of priority from Japanese Patent Application No. 2019-172387 filed on Sep. 23, 2019. The entire disclosures of all of the above applications are incorporated herein by reference.

TECHNICAL FIELD

The present disclosure relates to a design assistance tool used to develop a large-scale system, such as an autonomous driving system of a vehicle.

BACKGROUND

There has been known a program development method, which summarizes development target objects and development procedures in a table, defines a metamodel using a modeling tool, specifies blocks to be included in the metamodel, and defines a meaning of the metamodel.

SUMMARY

The present disclosure provides a design assistance tool, which assists a design of at least two processes, defines a metamodel using one or more metaclass in each of the at least two processes, and performs a design of each of the at least two processes using the corresponding metamodel. The design assistance tool defines a relationship between one metaclass included in one of the at least two processes and one metaclass included in another one of the at least two processes as a possession relationship or a reference relationship, and displays a design result based on the metamodels as a view on a display. In response to an occurrence of an inconsistency in the possession relationship or the reference relationship between the one metaclass included in one of the at least two processes and the one metaclass included in another one of the at least two processes due to creation, modification, or deletion of one metaclass in any one of the at least two processes, the design assistance tool allows the inconsistency and displays the inconsistency on the view of the display.

BRIEF DESCRIPTION OF DRAWINGS

Objects, features and advantages of the present disclosure will become apparent from the following detailed description made with reference to the accompanying drawings. In the drawings:

FIG. 16 is a diagram showing a design result of detail design in a software development;

FIG. 19 is a diagram showing a relationship between a databases and a view;

FIG. 21 is a diagram showing a data structure of a database;

DETAILED DESCRIPTION

Figure 1:
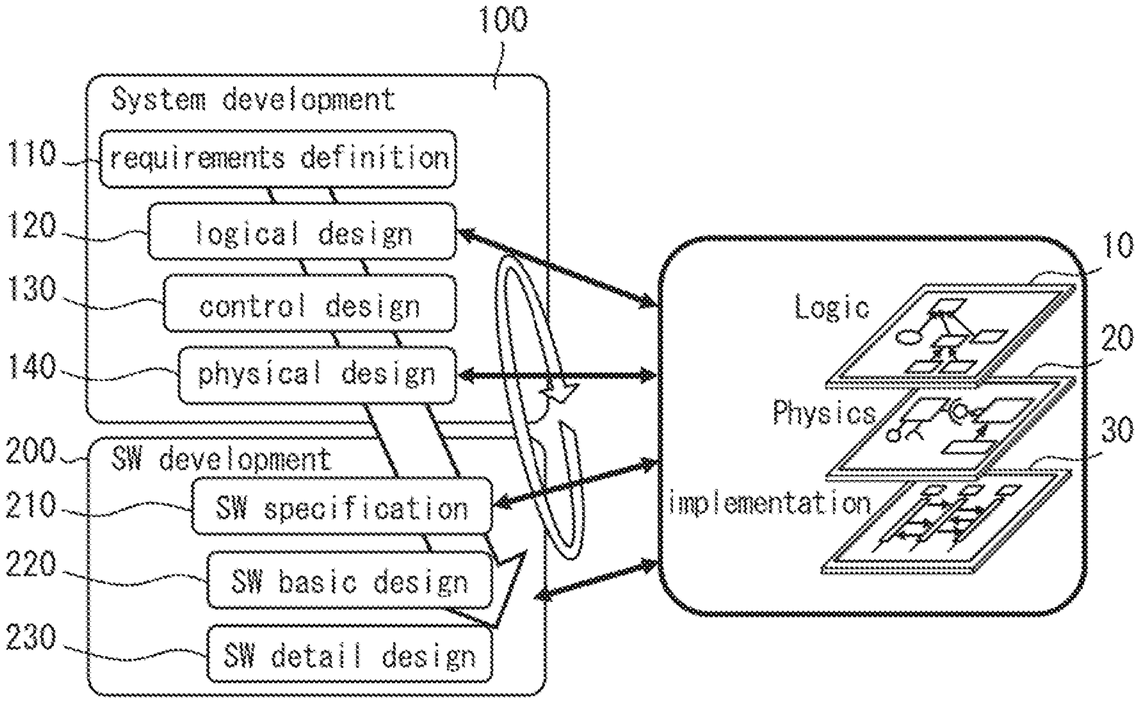
FIG. 1 is a diagram showing a procedure of system development.

The above-described metamodel generator, which is conventionally known, defines a metamodel, which includes contents that are strictly applied, and also defines a rewritable metamodel. The rewritable metamodel discloses a method of replacing A with B in a relationship between A and C when, for example, A is derived from B, A and B have a compound relationship with C, and C has 1:1 relationship with A.

However, in the development of an actual program, it is highly necessary to enable a designer to modify definitions and related operations with high flexibility without being strictly restricted by predetermined rules defined in the metamodel. The development of large system usually includes multiple related metamodels. In such a development, usually, multiple developers work on corresponding metamodels in parallel.

According to an aspect of the present disclosure, a design assistance tool, which assists a design of at least one process, defines a metamodel using two or more metaclasses in the at least one process, and perform a design of the at least one process using the metamodel.

In the above aspect, the design assistance tool defines a relationship between the two or more metaclasses of the metamodel as a possession relationship or a reference relationship, and displays a design result of the at least one process as a view on a display. In response to an occurrence of an inconsistency in the possession relationship or the reference relationship of the two or more metaclasses due to creation, modification, or deletion of any one of the two or more metaclasses, the design assistance tool allows the inconsistency and displays the inconsistency on the view of the display.

According to the above aspect, a designer can create, modify, and delete a metaclass with high flexibility without being restricted by any special rule, thereby providing a design assistance tool having a high design flexibility. When an inconsistency occurs with another metaclass due to creation, modification, or deletion of a metaclass, the inconsistency is displayed on a view of the display device. Thus, the designer can notice and resolve the inconsistency during the design operation.

According to another aspect of the present disclosure, a design assistance tool, which assists a design of at least two processes, defines a metamodel using one or more metaclass in each of the at least two processes, and performs a design of each of the at least two processes using the corresponding metamodel.

In the above aspect, the design assistance tool defines a relationship between one metaclass included in one of the at least two processes and one metaclass included in another one of the at least two processes as a possession relationship or a reference relationship, and displays a design result based on the metamodels as a view on a display.

In the above aspect, in response to an occurrence of an inconsistency in the possession relationship or the reference relationship between the one metaclass included in one of the at least two processes and the one metaclass included in another one of the at least two processes due to creation, modification, or deletion of one metaclass in any one of the at least two processes, the design assistance tool allows the inconsistency and displays the inconsistency on the view of the display.

According to the above aspect, a designer can create, modify, and delete a metamodel with high flexibility without being restricted by any special rule, thereby providing a design assistance tool having a high design flexibility. When an inconsistency occurs with another metamodel due to creation, modification, or deletion of a metamodel, the inconsistency is displayed on a view of the display device. Thus, the designer can notice and resolve the inconsistency during the design operation.

According to another aspect of the present disclosure, a design assistance tool, which assists a design of at least on process, defines a metamodel using one or more metaclasses in the at least one process, and performs a design of the at least one process using the metamodel.

In the above aspect, the design assistance tool defines a relationship between two or more components, which correspond to a design result based on the metamodel, as a possession relationship or a reference relationship, and display the design result as a view on a display.

In the above aspect, in response to an occurrence of an inconsistency in one of the two or more components, which correspond to the design result, due to creation, modification, or deletion of another one of the two or more components, the design assistance tool allows the inconsistency and displays the inconsistency on the view of the display.

According to the above aspect, a designer can create, modify, and delete a design result component with high flexibility without being restricted by any special rule, thereby providing a design assistance tool having a high design flexibility. When an inconsistency occurs with another component due to creation, modification, or deletion of a design result component, the inconsistency is displayed on a view of the display device. Thus, the designer can notice and resolve the inconsistency during the design operation.

According to another aspect of the present disclosure, the process in which the design based on the metamodel is performed includes requirement definition, logical design, control design, and physical design, which are performed in a system development, and includes specification definition, basic design, and detail design, which are performed in a software development. Thus, the process according to this aspect is suitable for a development of large-scale system.

According to another aspect of the present disclosure, the creation, modification, or deletion of one metaclass is performed in the view of the display. With this configuration, since the designer can operate a keyboard or a mouse while looking at the view of the display device, the design can be easily performed without requiring special programming ability.

According to another aspect of the present disclosure, the creation, modification, or deletion of one metaclass is reflected in the view of the display. With this configuration, the designer can examine the design result while looking at the view of the display device, thereby performing the design with facility.

According to another aspect of the present disclosure, the creation, modification, or deletion of one component is performed in the view of the display. With this configuration, since the designer can operate a keyboard or a mouse while looking at the view of the display device, the design can be easily performed without requiring special programming ability.

According to another aspect of the present disclosure, the creation, modification, or deletion of one component is reflected in the view of the display. With this configuration, the designer can examine the design result while looking at the view of the display device, thereby performing the design with facility.

The following will describe a general flow of system development using, as an example, an autonomous driving system of a vehicle. The procedure mainly includes a system development 100, and a software development 200 carried out after the system development to be suitable for the system.

As shown in FIG. 1, at first, the system development 100 performs a requirement definition 110. The requirement definition 110 sets development goals, such as cruise control. Then, a logical design 120 is carried out. The logical design 120 defines a function, and an input and an output. In a cruise control system, the input includes a driver's request, a travelling state of a vehicle, a road condition including a presence or absence of traffic congestion. The output includes control items for what kind of controls are to be performed, such as an accelerator level, a braking level, and a steering wheel operation.

Then, the system development 100 performs a control design 130. The control design 130 is a circuit design, and defines a calculation formula to be used for each control. For example, methods for vehicle speed detection and obstacle detection are defined.

Then, a physical design 140 is performed. The physical design 140 physically assigns a control to an ECU. For example, detection of vehicle speed may be assigned to a sensor ECU, which is capable of calculating the vehicle speed, or may be assigned to an engine control ECU, which is capable of calculating the vehicle speed.

The software development 200 develops a software which concretely includes an outline defined in the system development 100. At first, the software development 200 performs a specification definition 210. When the engine control ECU is assigned for the vehicle speed detection function in the physical design 140 of the system development, the software specification definition 210 defines specific details of the engine control ECU.

Next, a basic design 220 of software is performed. In the basic design 220, functions defined in the system development 100 are divided into multiple layers. Then, for each function, an input to be obtained and an output are defined. Further, when a problem exists between the input and the output, a check mechanism to specify the problem is defined.

Then, a detail design 230 of software is performed. The detail design defines a specific calculation method in a flowchart so that the calculation method can be described with a programming language. The detail design 230 defines source codes of the program.

In both of the system development 100 and the software development 200, when a design content is expressed from another viewpoint, a definition of logical formula 10, an arrangement design 20 for physically arranging the content, and an implementation process 30 for concretely implementing the process using an ECU are executed in a repeated manner.

The design procedure of top-down development in which the highest level process of requirement definition 110 is gradually detailed to the lower level process is described. In this design procedure, since design content is subdivided as the process progresses, consistent design can be implemented from top to down. However, it is extremely difficult for large and complex system because the above-described design procedure requires a complete understanding about the entire system. That is, system development cannot proceed unless it progresses to a certain level of detail.

Contrary to the above design procedure, in a design method of bottom-up development, at first, the individual parts included in the system are designed in detail, and then the parts are combined together to develop the system. This design method is suitable for using existing parts that have already been developed or suitable for developing multiple parts in parallel.

In some cases, an inconsistency may occur between high level processes due to the combination of each part with another, or an inconsistency may occur between one part and another part. In the bottom-up development, even though the optimum part can be developed, the optimum part is a partially optimized part but not a completely optimized part.

The design system according to the embodiment of the present disclosure can be applied to both of the top-down development and the bottom-up development since the design system has a flexibility which will be described later. However, in both of the top-down development and the bottom-up development, a great number of definitions exist from the requirement definition 110, which defines what kind of system to be developed, to the software detail design 230, which defines detail control and specific flowchart. These definitions are always required to be transferred to the next design procedure without inconsistency.

The design assistance tool according to the present embodiment can assist all of the development designs from the requirement definition 110 of the system development 100 to the detail design 230 of the software development 200. However, the design assistance tool according to the present embodiment does not necessarily assist the development design in all of the processes. Depending on the development content, for example, the design assistance tool may be used only for the system development 100, or only for the process of the requirement definition 110 in the system development 100, or for both of the requirement definition 110 in the system development 100 and the specification definition 210 in the software development 200.

In the configuration adopted by the design assistance tool in the present embodiment, the development from the requirement definition 110 in the system development 100 to the detail design 230 in the software development 200 are described as design target items in a metamodel 300, and the design is performed based on the metamodel.

Each of the design processes 110, 120, 130, 140, 210, 220, and 230 includes a formulation of the metamodel 300 that defines a direction of development, and a design result 305 that is obtained by the metamodel 300.

Figure 2:
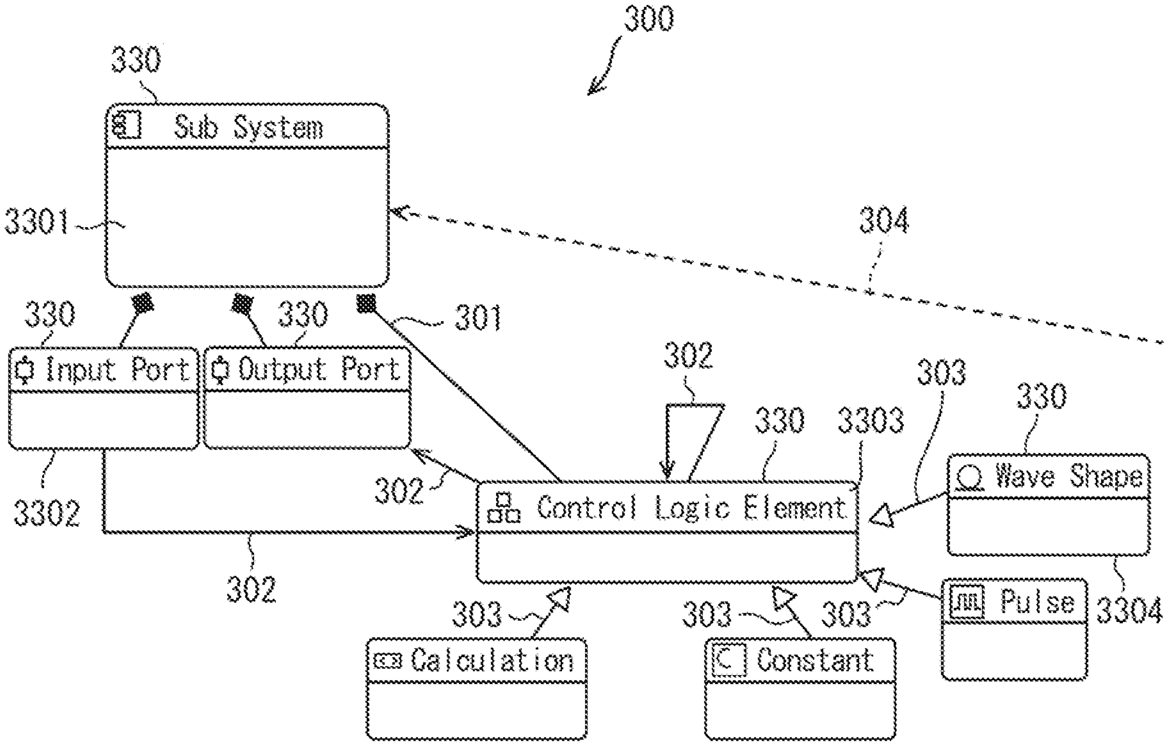
FIG. 2 is a diagram showing a metamodel.

As shown in FIG. 2, the metamodel 300 defines, using relationship lines, a relationship of multiple metaclasses 330 that configure the metamodel 300. In the example of FIG. 2, the line connecting a first metaclass 3301 and a second metaclass 3302 has a black square at the tip, and this line represents a possession 301, that is, a vertical relationship. Thus, the second metaclass 3302 at the lower level is an element of the first metaclass 3301 at the higher level.

In the example of FIG. 2, the arrow connecting the second metaclass 3302 and the third metaclass 3303 represents a reference 302. Thus, the content specified by the second metaclass 3302, for example, the field may operate with reference to the field specified by the third metaclass 3303. The reference 302 indicates that a certain relevance exists in the data exchanged between two metaclasses.

For example, when the second metaclass 3302 is an input port, the input port of the second metaclass 3302 has a relationship of reference 302 with the data of the control logic element of the third metaclass 3303. The relationship between the second metaclass 3302 and the third metaclass 3303 does not have to be the vertical relationship. The second metaclass 3302 and the third metaclass 3303 do not need to be included in the same process. It is also possible for the input port of the second metaclass 3302 to refer 302 the content of control logic element designed in another process.

In the example of FIG. 2, the line connecting the third metaclass 3303 and the fourth metaclass 3304 has a white-lined triangle at the tip, and this line represents a succession 303. Thus, the third metaclass 3303 is at the same level as the fourth metaclass 3304. That is, the fourth metaclass 3304 is one type of the third metaclass 3303.

For example, when the third metaclass 3303 is a control logic element and the fourth metaclass 3304 is a waveform, the waveform is provided as one type of the control logic element.

In the example of FIG. 2, the broken line represents a derivation 304, and the derivation 304 shows a relationship with another process. For example, in each process of the system development 100 and the software development 200, when the metaclass 330 of one process is connected with the metaclass 330 of another process by the derivation 304 relationship, the content of the metaclass 330 of another process is defined based on the content of the metaclass 330 of one process. The derivation 304 is used as traceability information, and the details will be described later. By specifying the relationship of derivation 304 between the request source and the request destination, it is possible to trace the design information across processes.

The design result 305 is a detailed content of the metaclass 330. For example, when the metaclass 330 is an input port, the design result 305 uses three input ports including a first input port, a second input port, and a third input port, and defines more specific content of the input port compared with the name and size of the input port. Thus, the design result 305 based on one metaclass may have multiple components. The relationship of multiple components of the design result may be the possession 301 or the reference 302.

The following will describe an application example of the design assistance tool of the present embodiment in more details by using development of autonomous driving system.

Figure 3:
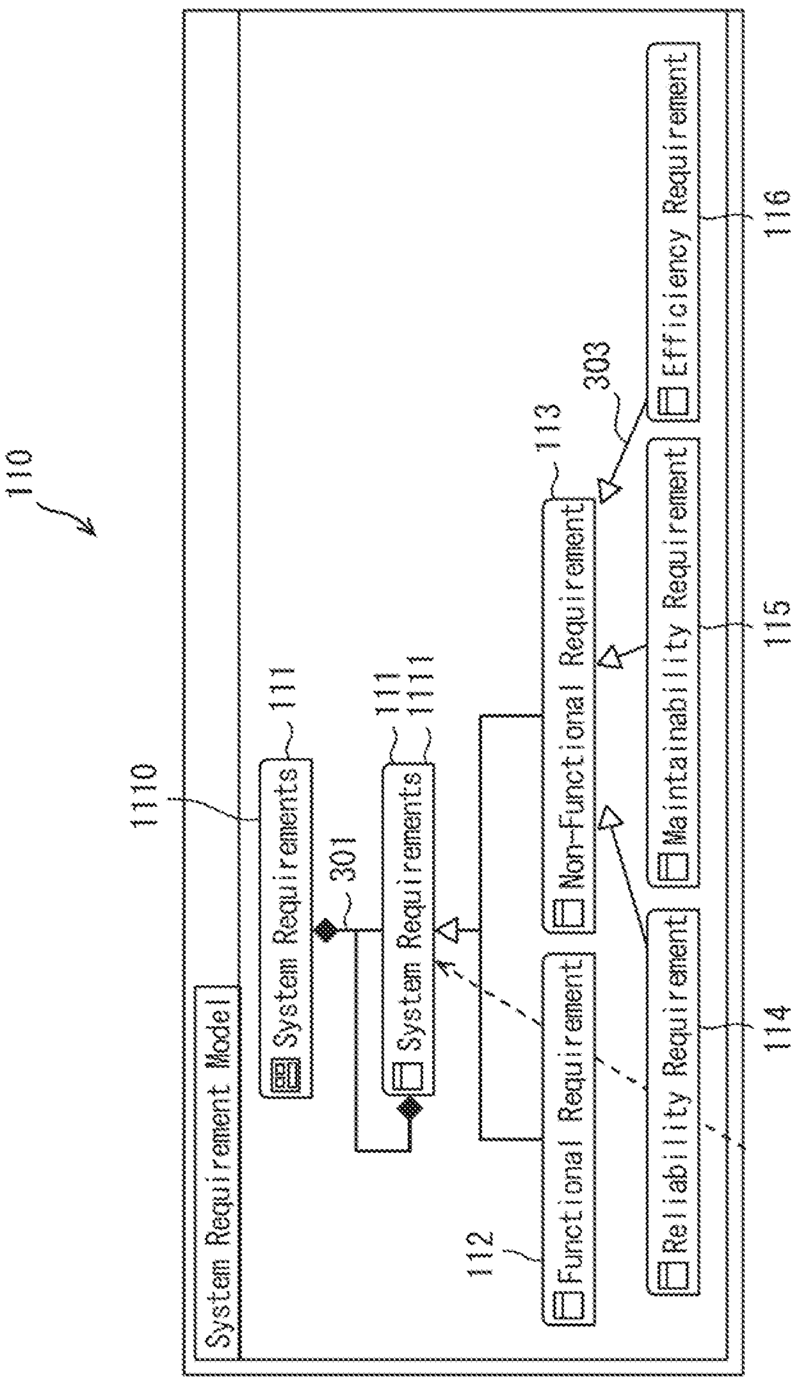
FIG. 3 is a diagram showing a requirement definition metamodel in a system development.

FIG. 3 shows an example of a metamodel 300 of the requirement definition 110. The system requirement 111 is an example of the metaclass 330, and the system requirement 111 further defines a first system requirement 1110 and a second system requirement 1111. The first system requirement 1110 has a possession 301 relationship with the second system requirement 1111. That is, in this metamodel 300, the system requirement 111 has a multiplex structure.

In the metamodel 300 of the requirement definition 110, the second system requirement 1111 has a succession 303 relationship with the metaclass 330 of the functional requirement 112 and the metaclass 330 of the non-functional requirement 113. The metaclass 330 of the non-functional requirement 113 has a succession 303 relationship with a metaclass 330 of reliability requirement 114, a metaclass 330 of maintainability requirement 115, and a metaclass 330 of efficiency requirement 116. Thus, the second system requirement 1111 is defined to have the functional requirement 112 and the non-functional requirement 113, and the non-functional requirement 113 includes the reliability requirement 114, the maintainability requirement 115, and the efficiency requirement 116.

Figure 4:
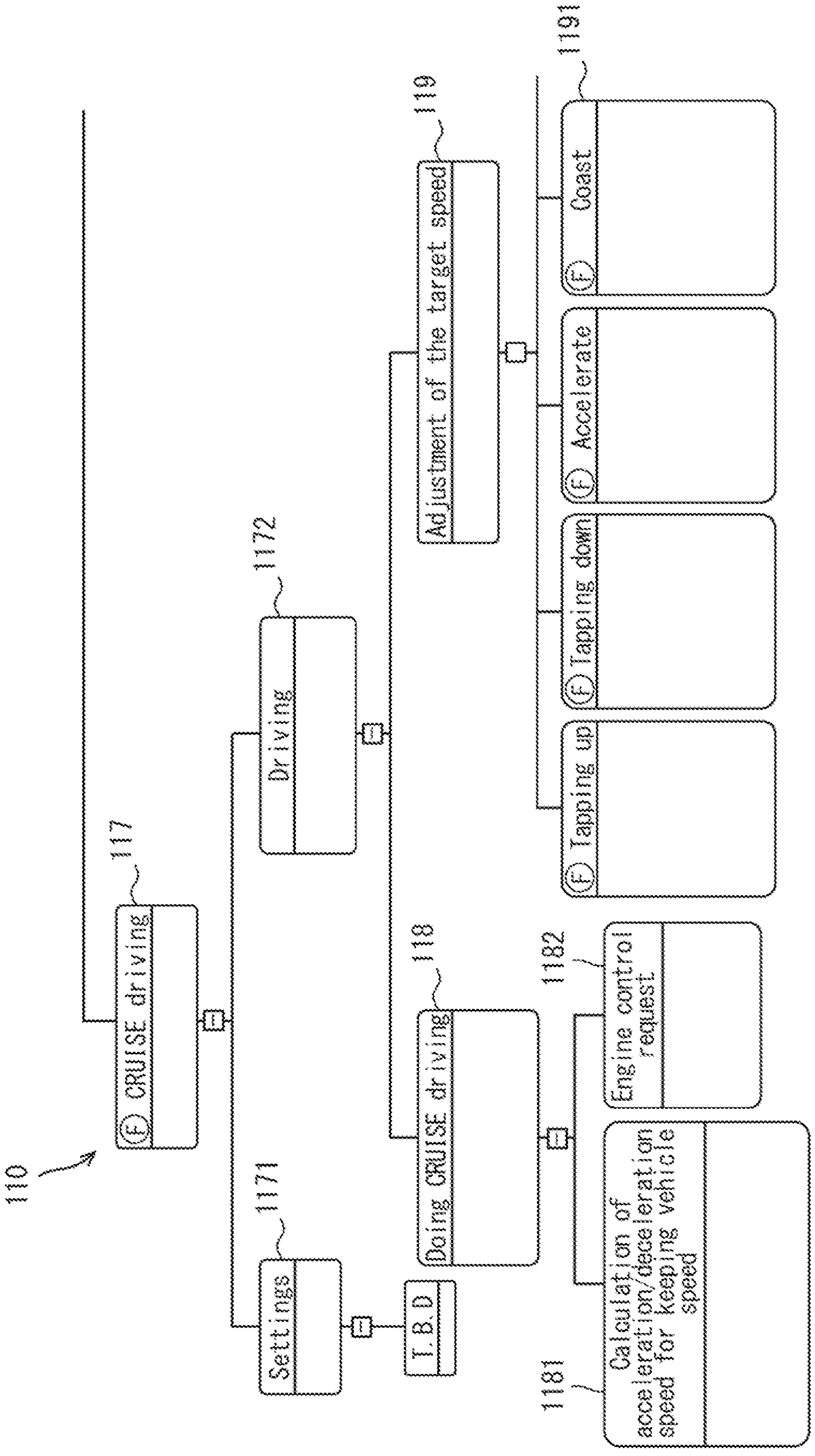
FIG. 4 is a diagram showing a design result of requirement definition in a system development.

The design of the requirement definition 110 is performed according to the metamodel 300 shown in FIG. 3. For example, an example of cruise control shown in FIG. 4 includes a constant speed travelling 117. In order to perform the constant speed travelling 117, settings 1171, which are performed by the driver, and a driving 1172, which includes various requirements for performing an actual constant speed travelling, are necessary. In the settings performed by the driver, signals input from various devices, such as setting switches are checked.

In order to define the driving 1172, doing cruise driving 118 and adjustment of the target speed 19 are necessary. In doing cruise driving 118, calculation of acceleration/deceleration for keeping target speed is performed, and a request is output to the engine control ECU. In the adjustment of the target speed 119, the speed adjustment is performed in various modes according to the driver's request. In the doing cruise driving 118, presence or absence of a preceding vehicle and a speed of the preceding vehicle, etc. are detected in an adaptive travelling mode to calculate a target speed as the calculation of acceleration/deceleration for keeping target speed 1181. In the doing cruise driving 118, a control request may be output to the engine control ECU to properly control the vehicle speed in more suitable manner as the engine control request 1182.

In order to adjust the target speed 119, presence of a request from the driver to increase the target speed or presence of a request from the driver to decrease the target speed is confirmed. When the target speed needs to be changed, the speed is gradually increased or decreased by restricting a sudden acceleration or deceleration. In the adaptive travelling mode, various check items 1191 such as a comparison between the target speed and the speed of the preceding vehicle are considered.

As described above, in the design of the requirement definition 110, the outline of the functions that the system needs to provide are defined as the system requirement 111, and the operations related to the function, the control targets related to the function are defined by the system requirement. The cruise driving 117, settings 1171, driving 1172, doing cruise driving 118, adjustment of target speed 119, items 1181, 1182, and check items 1191 correspond to the multiplexed system requirement 111, and correspond to the functional requirement 112 of the system requirement 111.

Each of the cruise driving 117, settings 1171, driving 1172, doing cruise driving 118, adjustment of target speed 119, items 1181, 1182, and check items 1191 corresponds to each component included in the design result 305. The relationship of the multiple components is reference 302 relationship.

Figure 5:
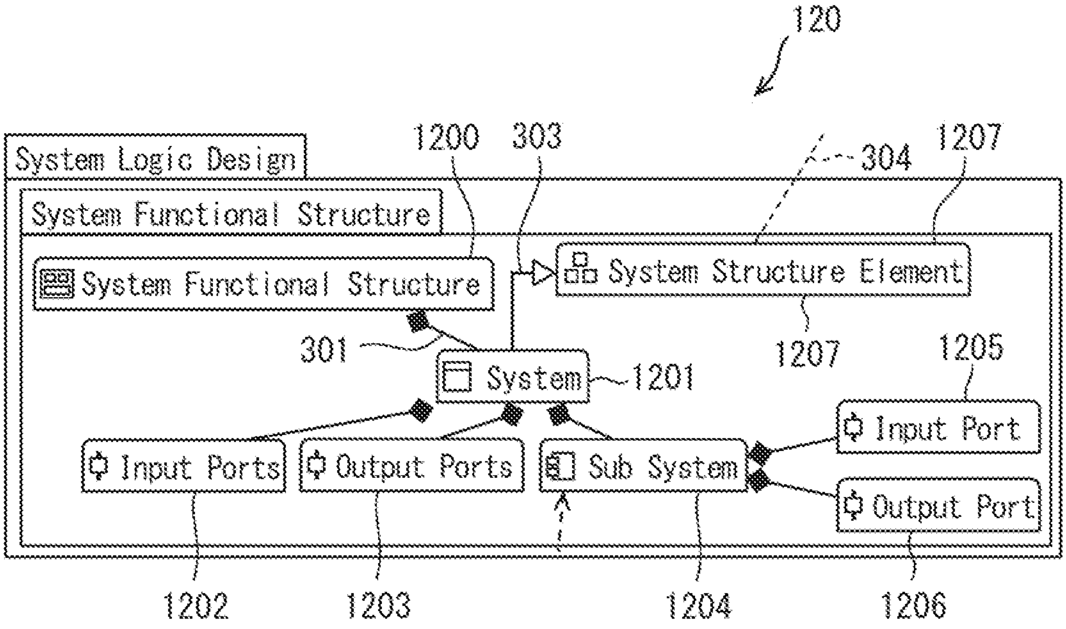
FIG. 5 is a diagram showing a logical design metamodel in a system development.

FIG. 5 shows an example of a metamodel 300 of the logical design 120. A metaclass 330 of the system 1201 has a possession 301 relationship with a system functional structure 1200. That is, the system functional structure 1200 includes the system 1201. The system 1201 has a possession 301 relationship with a metaclass 330 of an input port 1202, a metaclass 330 of an output port 1203, and a metaclass 330 of a subsystem 1204. That is, the system 1201 has the input port 1202, the output port 203 and the subsystem 1204. Similarly, the subsystem 1204 has an input port 1205 and an output port 1206.

The system 1201 has a succession 303 relationship with a metaclass 330 of a system structure element 1207. That is, the system 1201 includes the system structure element 1207. The metaclass 330 of the system structure element 1207 defines a derivation 304 relationship with the system requirement 111 of the metamodel 300 of requirement definition 110, more specifically, with the metaclass 330 of the second system requirement 1111. Thus, the system 1201 of the logical design 120 is a system derived from the system requirement 111 of the requirement definition 110 via the system structure element 1207.

Figure 6:
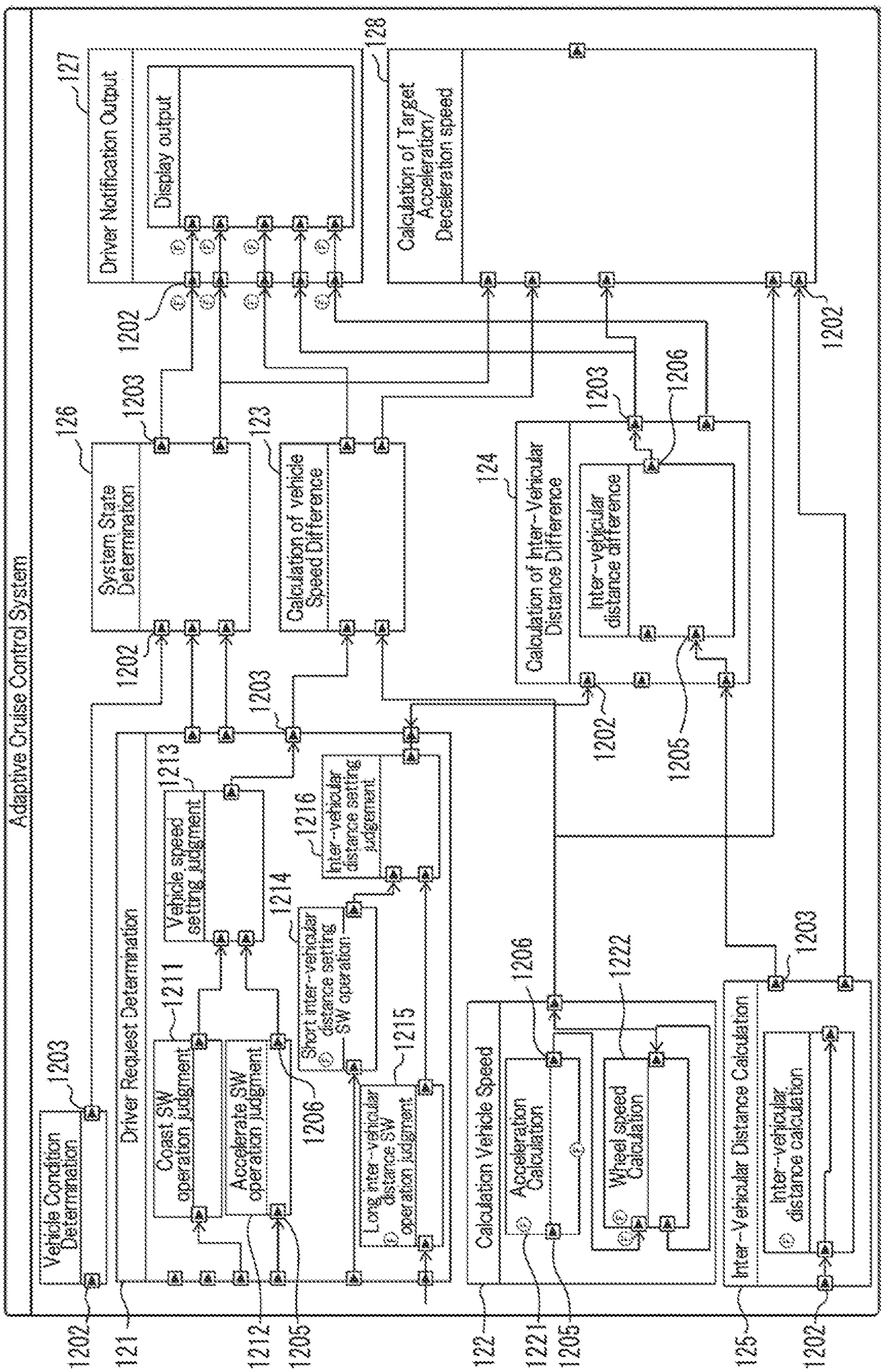
FIG. 6 is a diagram showing a design result of logical design in a system development.

As shown in FIG. 6, the logical design 120 includes, for example, a driver request determination item 121, and the driver request determination 121 performs vehicle speed setting judgement 1213 based on a deceleration judgement 1211, which determines whether the operation for requesting deceleration has been performed by the driver, and an acceleration judgement 1212, which determines whether the operation for requesting acceleration has been performed by the driver. Further, the driver request determination 121 performs an inter-vehicular distance setting judgement 1216, which determines an inter-vehicular distance, based on a short inter-vehicular distance determination 1214 in which execution of driver operation for decreasing the inter-vehicular distance is determined and a long inter-vehicular distance determination 1215 in which execution of driver operation for increasing the inter-vehicular distance is determined.

Similarly, in a vehicle speed calculation item 122, the vehicle speed is calculated by an acceleration calculation 1221, which calculates an acceleration/deceleration based on the signals from various sensors, and a wheel speed calculation 1222, which determines an actual wheel speed. Then, a difference between the vehicle speed calculated by the vehicle speed calculation item 122 and a required vehicle speed determined by the vehicle speed setting judgement 1213 of the driver request determination item 121 is calculated by a vehicle speed difference calculation item 123. Similarly, an inter-vehicular distance difference calculation item 124 calculates a difference between the inter-vehicular distance setting judgement 1216 specified in the driver request determination item 121 and the inter-vehicular distance specified in the inter-vehicular distance calculation item 125 using an inter-vehicular distance difference calculation 1241.

Various types of information, such as a difference between a set inter-vehicular distance and an actual inter-vehicular distance acquired from the inter-vehicular distance difference calculation item 124, a difference between a set vehicle speed and an actual vehicle speed acquired from the vehicle speed difference calculation item 123, cruise control on/off state and cruise control mode acquired from a system state determination item 126 are input to a driver notification output item 127 and a target acceleration/deceleration calculation item 128.

The driver notification output item 127 determines how quickly and appropriately display the information, such as the vehicle speed to the driver by a display output 1271, and determines the information to be output to various devices, such as a meter. The target acceleration/deceleration calculation item 128 calculates a target acceleration/deceleration to be output to the engine control ECU.

In relation to the metamodel 300, for example, the system functional structure 1200 may show the overall structure. The system 1201 included in the system functional structure 1200 may correspond to the driver request determination item 121, the vehicle speed calculation item 122, the vehicle speed difference calculation item 123, the inter-vehicular distance difference calculation item 124, the inter-vehicular distance calculation item 125, the system state determination item 126, the driver notification output item 127, and the target acceleration/deceleration calculation item 128. Each system 1201 is provided with the input port 1202 and the output port 1203.

When the driver request determination item 121 corresponds to the system 1201, the deceleration judgement 1211, the acceleration judgement 1212, the vehicle speed setting judgement 1213, the short inter-vehicular distance determination 1214, the long inter-vehicular distance determination 1215, and the inter-vehicular distance setting judgement 1216 correspond to the subsystem 1204. Each subsystem 1204 includes the input port 1205 and the output port 1206.

Regarding the relationship between the metaclass 330 and the components of the design result 305, the subsystem 1204 corresponds to the metaclass 330, and the deceleration judgement 1211, the acceleration judgement 1212, the vehicle speed setting judgement 1213, the short inter-vehicular distance determination 1214, the long inter-vehicular distance determination 1215, and the inter-vehicular distance setting judgement 1216 correspond to respective components of the design result 305.

Figure 7:
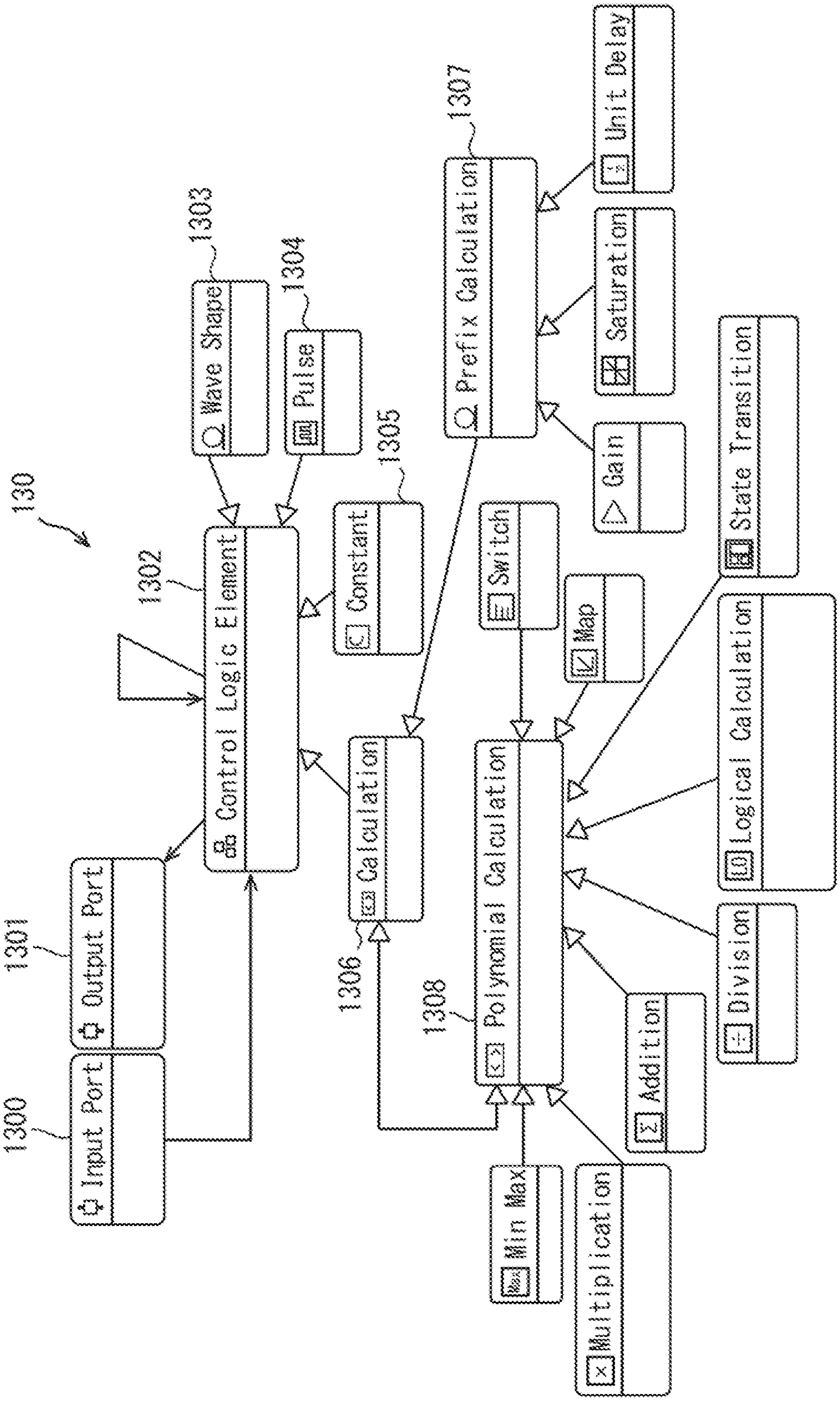
FIG. 7 is a diagram showing a control design metamodel in a system development.

The following will describe the metamodel 300 of the control design 130 with reference to FIG. 7. The control design 130 designs the control content of the logical design 120 in the system 1201 or in the subsystem 1204, and includes an input port 1300 and an output port 1301. The input port 1300 of the control design 130 corresponds to the input port 1202 of the system 1201 and the input port 1205 of the subsystem 1204. The output port 1301 of the control design 130 corresponds to the output port 1203 of the system 1201 and the output port 1206 of the subsystem 1204.

As shown in FIG. 7, a control logic element 1302 has a reference 302 relationship with the input port 1300 and the output port 1301, and the input port and the output port of the logical design 120 refer to the control logic element 1302.

A metaclass 330 of the control logic element 1302 has a succession 303 relationship with a wave shape 1303, a pulse 1304, a constant 1305, and a calculation 1306. Thus, the control logic element generates a control logic using the wave shape 1303, the pulse 1304, the constant 1305, and the calculation 1306.

A metaclass 330 of the calculation 1306 has a succession 303 relationship with a metaclass 330 of prefix calculation 1307 and a metaclass 330 of polynomial calculation 1308. The metaclass 330 of the prefix calculation 1307 and the metaclass 330 of the polynomial calculation 1308 each has a succession 303 relationship with other multiple metaclasses 330. The calculation 1306 is performed using the items included in these metaclasses 330.

Figure 8:
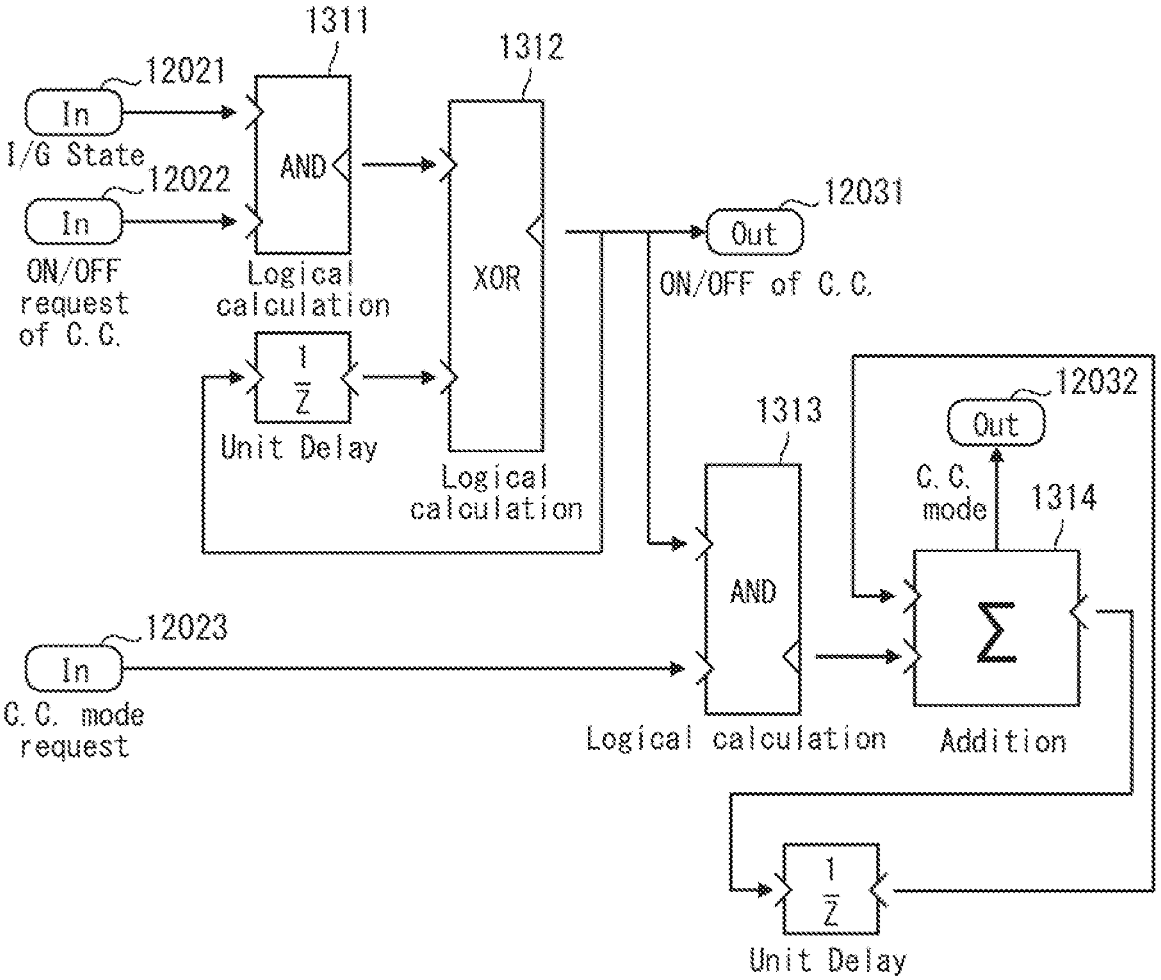
FIG. 8 is a diagram showing a design result of control design in a system development.

FIG. 8 shows an example of the control design 130. This example corresponds to the system state determination item 126 of the logical design 120. A first AND circuit 1311 calculates a signal 12021 indicating an ignition switch corresponding to the input port 1202 being turned on, and a signal 12022 indicating an ON/OFF state of the cruise control. Then, the signal output from the first AND circuit 1311 and a delay signal of unit are logically calculated by XOR circuit 1312, and the ON/OFF state of the cruise control is output. The output 12031 corresponds to the output port 1203 of the logical design 120.

Further, the output from the XOR circuit 1312 and a cruise control mode signal 12023 are logically calculated by a second AND circuit 1313. Here, the mode signal 12023 corresponds to the input port 1202 of the logical design 120. Then, the output of the second AND circuit 1313 and the delay signal of the unit are added by an addition circuit 1314, and the cruise control mode is output. The output 12032 corresponds to the output port 1203 of the logical design 120.

As described above, in the control design 130, the items defined in the logical design 120 are implemented by a concrete logical calculation formula. In the relationship between the metamodel 300 and the design result 305, the input port corresponds to the metaclass 330. The components of the design result 305 include the signal 12021 indicating the ignition switch being turned on, and the signal 12022 indicating the ON/OFF state of the cruise control.

Figure 9:
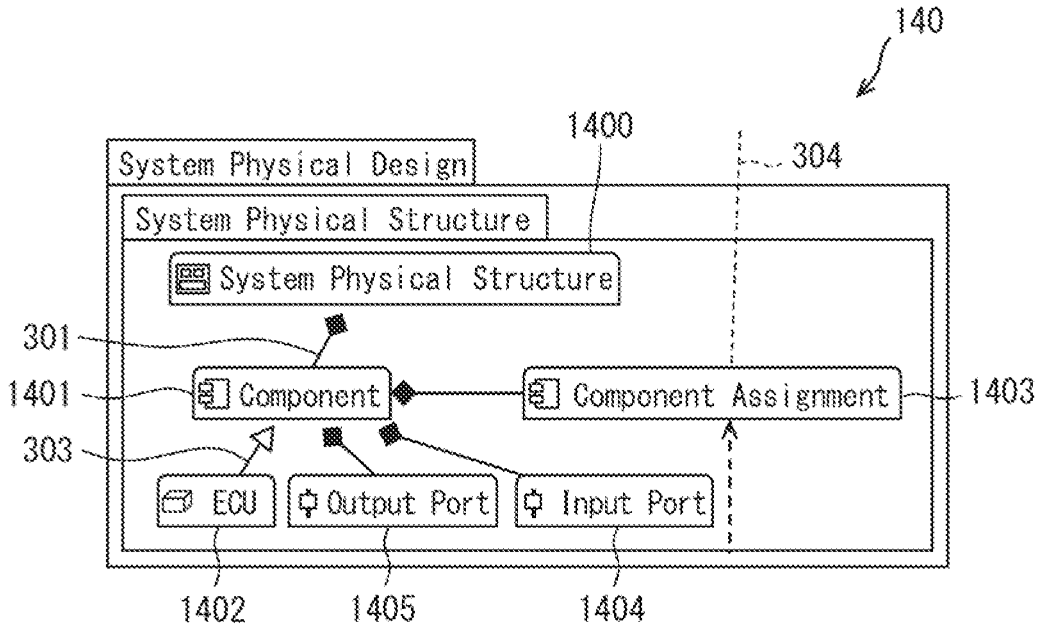
FIG. 9 is a diagram showing a physical design metamodel in a system development.

FIG. 9 shows an example of a metamodel 300 of the physical design 140. The highest level is a metaclass 330 of a system physical structure 1400, and the system physical structure 1400 has a possession 301 relationship with a metaclass 330 of a component 1401. The component 1401 has a succession 303 relationship with a metaclass 330 of an ECU 1402. Thus, the ECU 1402 is an example of the component 1401.

The metaclass 330 of the component 1401 has a possession 301 relationship with a metaclass 330 of a function component assignment 1403, a metaclass 330 of an input port 1404, and a metaclass of an output port 1405. Thus, the component 1401 (that is, the ECU 1402) includes the function component assignment 1403, the input port 1404, and the output port 1405.

The function component assignment 1403 of the physical design 140 has a derivation 304 relationship with the subsystem 1204 of the logical design 120. Thus, the subsystem 1204 performs the function assigned by the function component assignment 1403. The function component assignment 1403 also has a derivation 304 relationship with the software specification definition 210, and this relationship will be described later.

Figure 10:
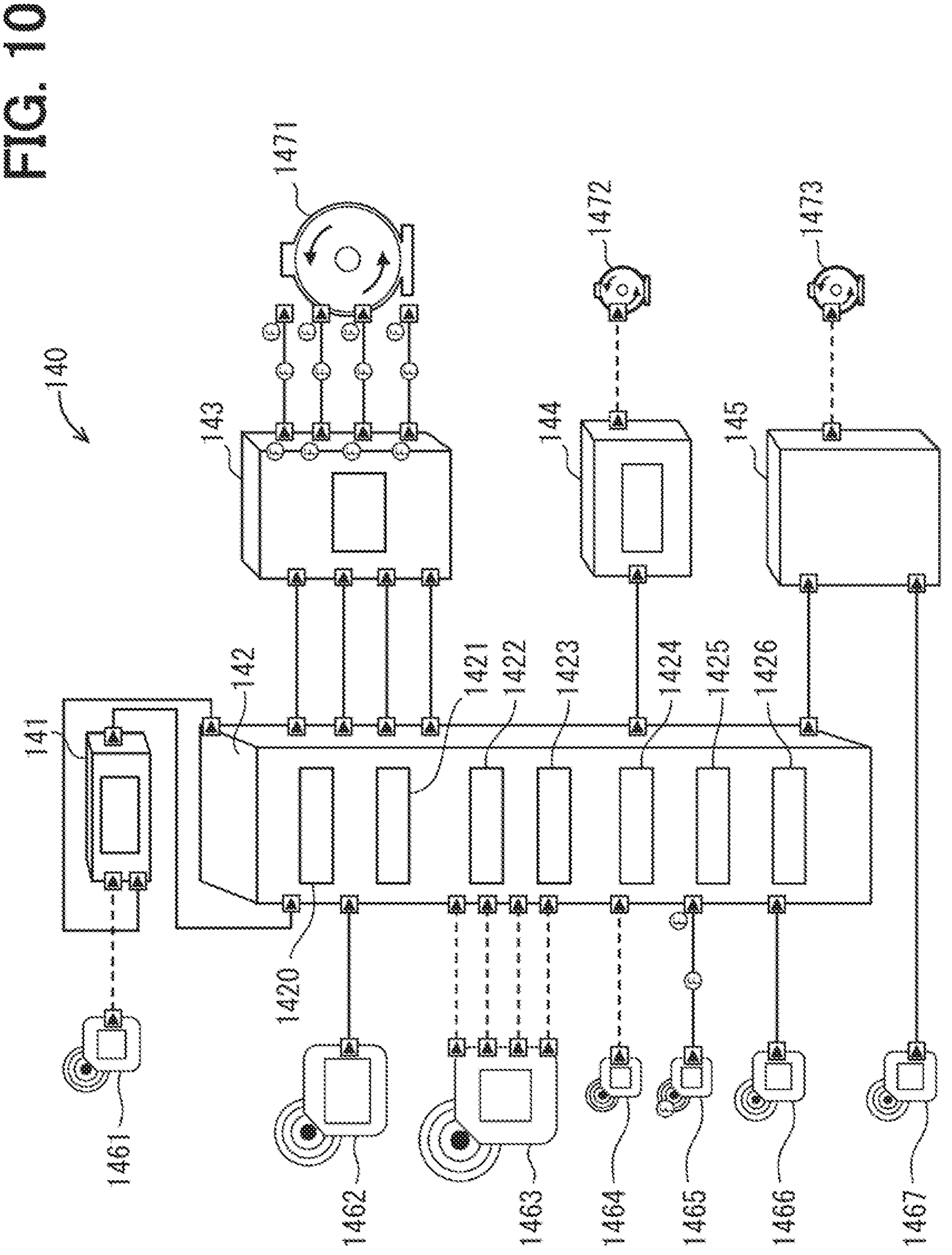
FIG. 10 is a diagram showing a design result of physical design in a system development.

FIG. 10 shows an example of the design result 305 of the physical design. In this example, examples of the ECU 1402 which implement different functions include a brake ECU 141, an ADAS ECU 142 that assists the autonomous driving, a meter ECU 143, an engine control ECU 144, and a power steering ECU 145.

The sensor signals input to the ECUs 141, 142, 142, 144, 145 correspond to the input port 1404. The present embodiment includes the following examples. A wheel speed sensor 1461 outputs a pulse signal indicating the wheel speed. A millimeter wave radar 1462 calculates the inter-vehicular distance with the preceding vehicle using an embedded ECU, and outputs the inter-vehicular distance signal as the calculation result. The driver request setting is determined based on operations made on various buttons which are displayed on a touch panel 1463. The driver operations may include cruise control mode, vehicle speed setting, turn-on or turn-off of the cruise control, and the inter-vehicular distance setting.

An engine state, that is, an activated state or deactivated state is determined based on an on/off signal from an ignition switch 1464. A travelling lane is detected by image information output from a camera 1465. The yaw rate and the acceleration/deceleration in the traveling direction are detected based on a signal output from an acceleration sensor 1466. The steering angle of the steering wheel is detected based on a signal output from a steering sensor 1467.

As the processing content of each ECU 1402, for example, the ADAS ECU 142 that assists the autonomous driving includes the following operation. The ADAS ECU 142 includes an inter-vehicular distance calculation 1420, a vehicle speed difference calculation 1421, an inter-vehicular distance difference calculation 1422, a driver input determination 1423, a target acceleration/deceleration calculation 1424, a system state determination 1425, and a vehicle state determination 1426.

Output targets of the calculation result calculated by each ECU 1402 include a display indicating the set inter-vehicular distance from the meter ECU 143, a cruise control on/off display, a set vehicle speed display, and a cruise control mode display. These displays are output to a vehicle-mounted display 1471.

The engine control ECU 144 outputs a rotation signal of a throttle motor 1472 to the throttle valve that controls the intake air amount, more specifically, to the throttle motor 1472 that rotates the throttle valve. The power steering ECU 145 outputs a rotation signal of a power steering motor 1473 to the power steering device. These outputs correspond to the output port 1405 of the metamodel 300.

The relationship between the metamodel 300 and the design result 305 is as described above. For example, when the metaclass 330 corresponds to the ECU 1402, the brake ECU 141, the ADAS ECU 142 that assists the autonomous driving, the meter ECU 143, the engine control ECU 144, and the power steering ECU 145 correspond to the components of the design result 305.

Figure 11:
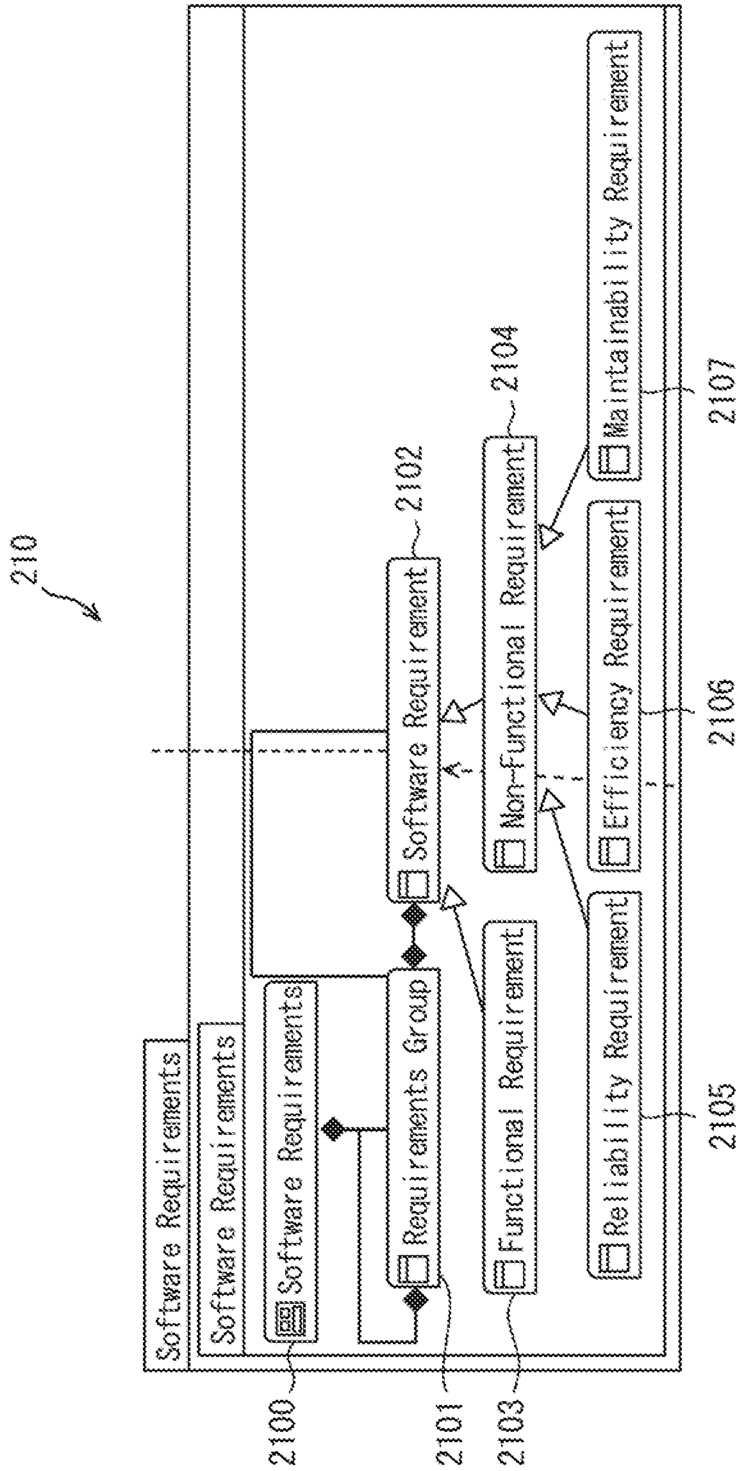
FIG. 11 is a diagram showing a specification definition metamodel in a software development.

The following will describe details of the software development 200. FIG. 11 shows an example of the metamodel 300 of the software specification definition 210. Each of a metaclass 330 of a software requirement specification 2100, a metaclass 330 of a requirement group 2101, and a metaclass 330 of a software requirement 2102 has a possession 301 relationship with one another. Thus, the software requirement specification 2100 includes the requirement group 2101, and the requirement group 2101 includes the software requirement 2102, in a multiplex structured manner.

The metaclass 330 of the software requirement 2102 has a succession 303 relationship with a metaclass 330 of a functional requirement 2103 and a metaclass 330 of a non-functional requirement 2104. The metaclass 330 of the non-functional requirement 2014 has a succession 303 relationship with a metaclass 330 of a reliability requirement 2105 and a metaclass 330 of an efficiency requirement 2106, and a metaclass 330 of a maintainability requirement 2107. Thus, the software requirement 2102 defines the functional requirement 2103 and the non-functional requirement 2104. The non-functional requirement 2104 includes the reliability requirement 2105, the efficiency requirement 2106, and the maintainability requirement 2107.

The metaclass 330 of the software requirement 2102 has a derivation 304 relationship with the metaclass 330 of the function component assignment 1403 of the physical design 140 in the system development 100. Thus, the functions specified in the function component assignment 1403 correspond to the functional requirement 2103 and the non-functional requirement 2104 included in the software requirement 2102.

Figure 12:
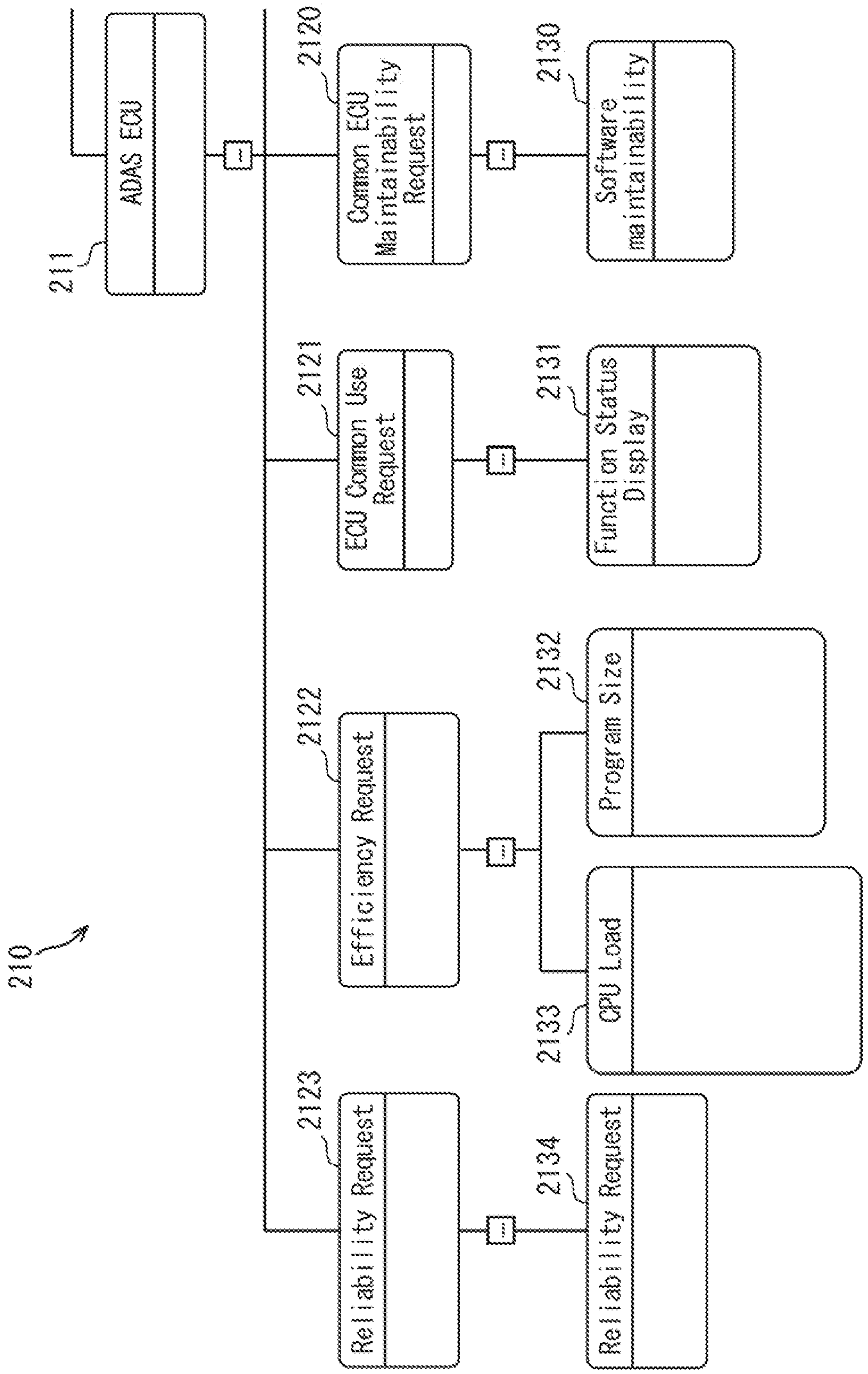
FIG. 12 is a diagram showing a design result of specification definition in a software development.

FIG. 12 shows an example of the design result 305 of the software specification definition 210 in the software development 200. The software specification definition 210 defines an execution content of a software corresponding to each ECU 1402. For example, an item 211 corresponding to the ADAS ECU 142 includes a maintainability request 2120 related to a maintainability common to the ECUs, a use request 2121 related to usability common to the ECUs, an efficiency requirement 2122 related to an efficiency of each ECU, and a reliability request 2123 related to a reliability of each ECU.

Each request 2120 to 2123 has lower level layers. For example, the maintainability request 2120 includes a software maintainability request 2130 that reduces the number of changes in the software when the software is also applied to other vehicles. The use request 2121 includes a function status display request 2131 that requests a constant display of an activated function among the functions for autonomous driving assistance purpose to the user (driver).

The efficiency request 2122 includes a program size request 2132 and a CPU load request 2133. The program size request 2132 is, for example, a request to keep a ratio of an actually used area to an entire memory area within a range of 70% for each of various memories. The CPU load request 2133 is a request for suppressing an average processing load of the CPU within a range of 60% in a normal state of steady autonomous driving assistance. As an example of the steady autonomous driving assistance may include a case where the vehicle is always ready to activate an emergency brake and keep the inter-vehicular distance with the preceding vehicle by performing the adaptive travelling at a constant speed along the travelling lane (lane keeping assist).

The reliability request 2123 may include a part reliability request 2134. The part reliability request 2134 continues an operation of one part, which is not affected by an abnormality when the abnormality is occurred in another part of the software. Each of the requests 2120 to 2123 and 2130 to 2134 corresponds to the non-functional requirement 2104 of the metamodel 300. Thus, in the relationship between the metamodel 300 and the design result 305, the non-functional requirement 2104 corresponds to the metaclass 330, and the requests 2120 to 2123 and 2130 to 2134 correspond to the components of the design result 305.

Figure 13:
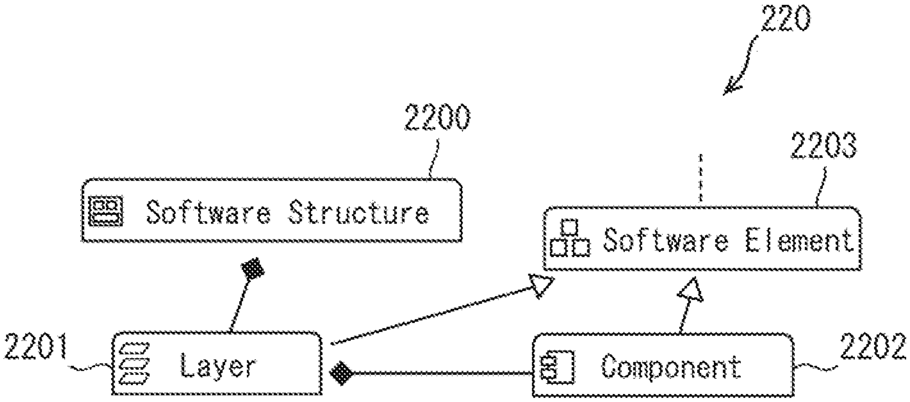
FIG. 13 is a diagram showing a basic design metamodel in a software development.

FIG. 13 shows an example of a metamodel 300 of the software basic design 220. The software basic design 220 defines functions and data for performing the requirements defined in the software specification definition 210. A metaclass 330 of a software structure 2200 has a possession relationship with a metaclass 330 of a layer 2201, and the metaclass of layer 2201 has a possession relationship with a metaclass 330 of a component 2202. Thus, the software structure 2200 includes the layer 2201, and the layer 2201 includes the component 2202.

Each of the metaclass 330 of the layer 2201 and the metaclass 330 of the component 2202 has a succession 303 relationship with a metaclass 330 of a software element 2203. Thus, types of the software element 2203 include the layer 2201 and the component 2202.

The metaclass 330 of the software element 2203 has derivation 304 relationship with the metaclass 330 of the software requirement 2102 of the software specification definition 210. Thus, the layer 2201 of the software basic design 220 and the component 2202 included in the layer 2201 are related to the software requirement 2102 of the software specification definition 210.

Figure 14:
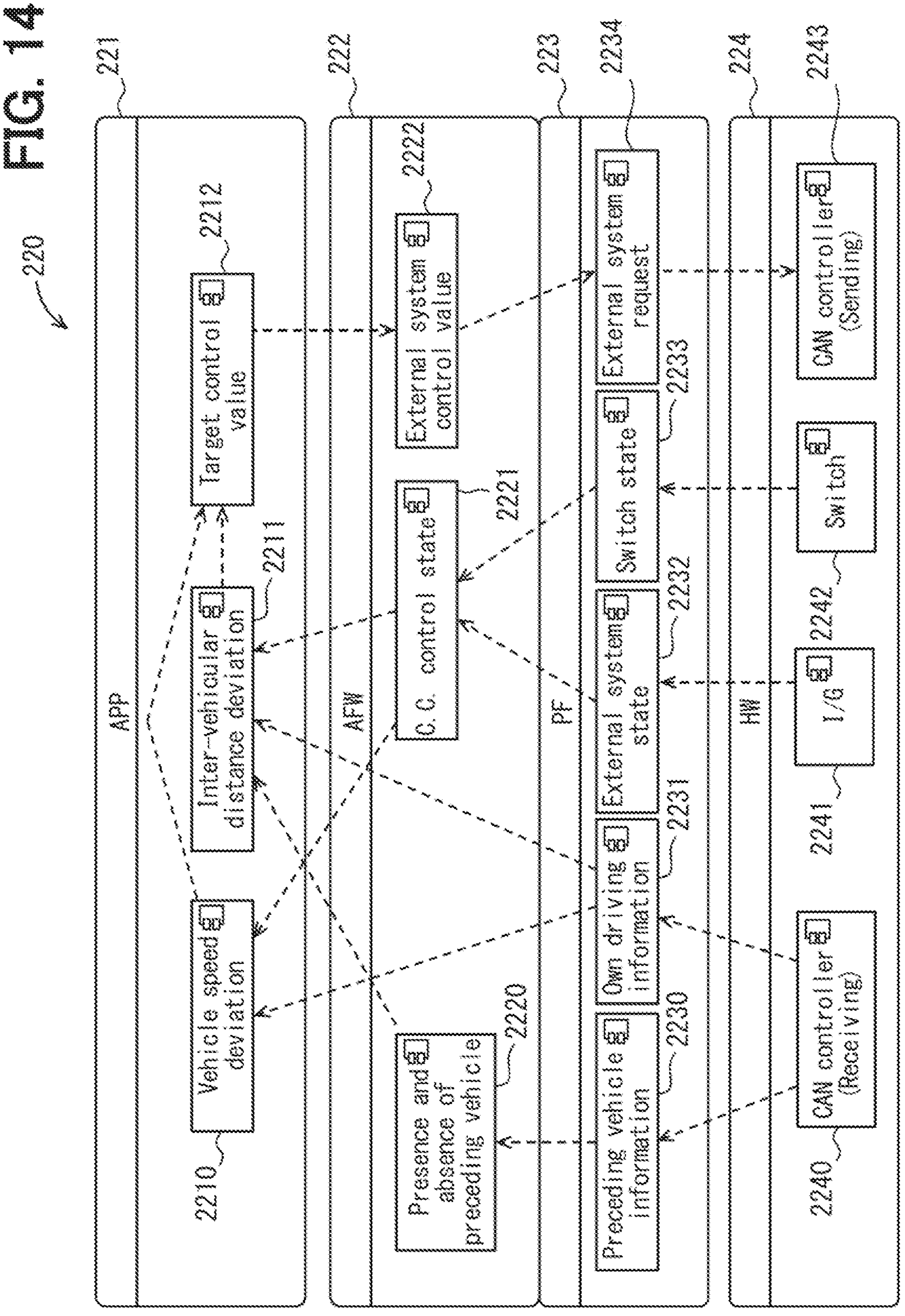
FIG. 14 is a diagram showing a design result of basic design in a software development.

FIG. 14 shows an example of the design result 305 of the software basic design 220. For example, in the autonomous driving, an application layer (APP layer) 221 has a vehicle speed deviation 2210, an inter-vehicular distance deviation 2211, and a target control value 2212. An application framework layer (AFW layer) 222, which is the layer below the APP layer, includes a presence and absence of a preceding vehicle 2220, a cruise control control state 2221, and an external system control value 2222.

A platform layer (PF layer) 223, which is the layer below the AFW layer, includes a preceding vehicle information 2230, an own vehicle driving information 2231, an external system state 2232, a switch state 2233, and an external system request 2234. A hardware layer (HW layer) 224, which is the lowest layer, includes, as output devices that output signals for the items included in the higher levels, a network controller (reception purpose) 2240 that are usable by in-vehicle devices, an ignition switch 2241, various switches 2242, and a network controller (transmission purpose) 2243 that are usable by the in-vehicle devices.

Thus, the APP layer 221, the AFW layer 222, the PF layer 223, and the HW layer 224 correspond to the layer 2201 of the metamodel 300. The items of the vehicle speed deviation 2210, the inter-vehicular distance deviation 2211, and the target control value 2212 correspond to the components 2202 of the layer 2201. The items of the presence and absence of preceding vehicle 2220, the cruise control control state 2221, and the external system control value 2222 also correspond to the components 2202 of the layer 2201. The items of the preceding vehicle information 2230, the own vehicle driving information 2231, the external system state 2232, the switch state 2233, and the external system request 2234 also correspond to the components 2202 of the layer 2201. The items of the network controller (reception purpose) 2240, the ignition switch 2241, the various switches 2242, and the network controller (transmission purpose) 2243 also correspond to the components 2202 the layer 2201. As described above, the network controller (reception purpose) 2240 and the network controller (transmission purpose) 2243 are usable by the in-vehicle devices.

In FIG. 14, the relationships among the four layers, which include the APP layer 221 to the HW layer 224, are shown by the broken line arrows. For example, the signal from the ignition switch 2241 of the HW layer 224 is output to the external system state 2232 of the PF layer 223, and then is output to the cruise control control state 2221 of the AFW layer 222 together with the switch state 2233. Then, the control state 2221 is output to the vehicle speed deviation 2210 and the inter-vehicular distance deviation 2211 of the APP layer 221.

Thus, the arrows in FIG. 14 show the relationship between each layer 2201 of the design result 305. The arrows in FIG. 14 have not relationship with the arrows of the metamodel 300.

The relationship between the metamodel 300 and the design result 305 is described as above. For example, when the layer 2201 corresponds to the metaclass 330, the APP layer 221, the AFW layer 222, the PF layer 223, and the HW layer 224 correspond to the components of the design result 305.

Figure 15:
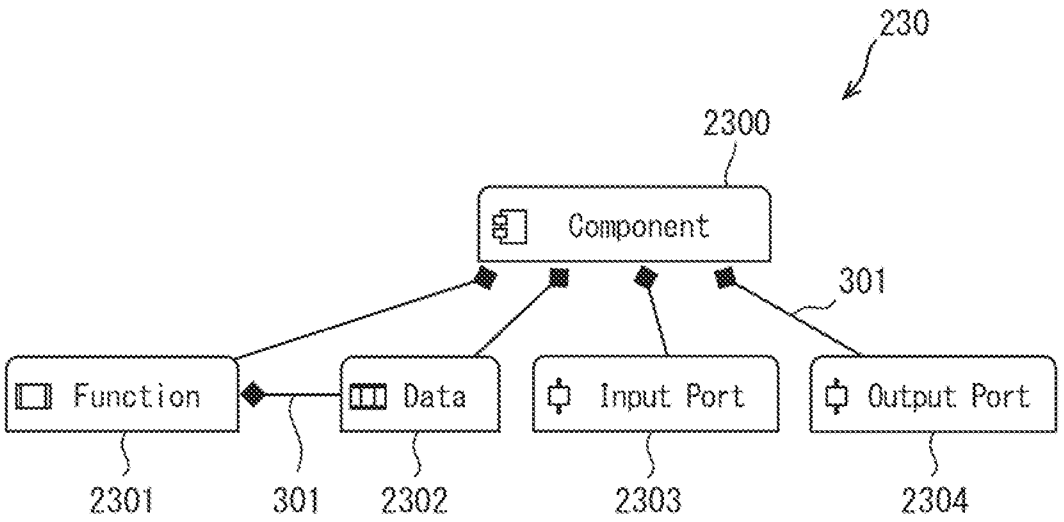
FIG. 15 is a diagram showing a detail design metamodel in a software development.

The software detail design 230 defines detailed controls for implementing the functions of the basic design 220. An example of the metamodel 300 is shown in FIG. 15. A metaclass 330 of a component 2300 is the same as the metaclass 330 of the component 2202 of the basic design 220.

The metaclass 330 of the component 2300 has a possession 301 relationship with a metaclass 330 of a function 2301, a metaclass 330 of data 2302, a metaclass 330 of an input port 2303, and a metaclass 330 of an output port 2304. Thus, the component 2300 includes the function 2301, the data 2302, the input port 2303, and the output port 2304.

Since the metaclass 330 of the data 2302, which has the possession 301 relationship, is possessed by the metaclass 330 of the function 2301, the data 2302 is used by the component 2300 and also used by the function 2301.

The design result 305 of the software detail design 230 defines an arithmetic processing by using, for example, a flowchart or a table as shown in FIG. 16. In the example shown in FIG. 16, input items 231 include "1. cruise control state", "2. vehicle speed", "3. presence and absence of preceding vehicle", "4. measured distance between the actual vehicles", and "5. inter-vehicular distance setting". The output item 232 includes "1. difference between measured inter-vehicular distance and set inter-vehicular distance". The internal data 233 includes "1. target vehicle speed" and "2. actually measured current vehicle speed".

Figure 17:
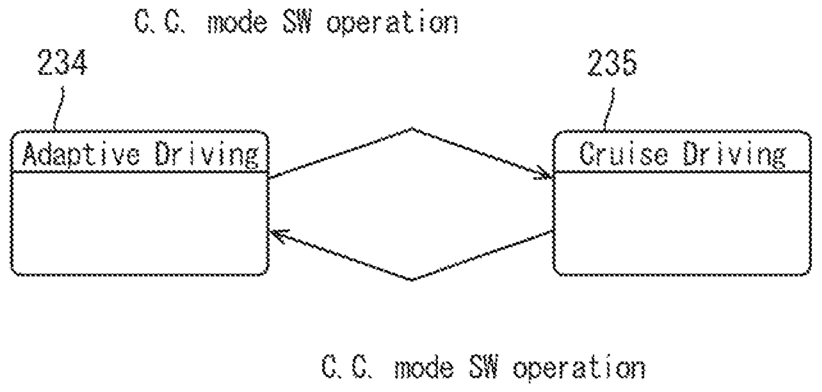
FIG. 17 is a diagram showing a design result of detail design in a software development.

The examples of the design result 305 of the software detail design 230 may further include, in addition to the above example, a state transition between an adaptive driving 234 and a cruise driving 235 in response to an operation of cruise control switch using a state transition control as shown in FIG. 17. The definitions of the adaptive driving 234 and the cruise driving 235 are not described in the state transition shown in FIG. 17. However, in an actual detail design, the definitions are defined in details.

The relationship between the metamodel 300 and the design result 305 is described as above. For example, when the input items 231 correspond to the metaclass 330, "1. cruise control state", "2. vehicle speed", "3. presence and absence of preceding vehicle", "4. measured distance between the actual vehicles", and "5. inter-vehicular distance setting" correspond to the components of the design result 305.

Figure 18:
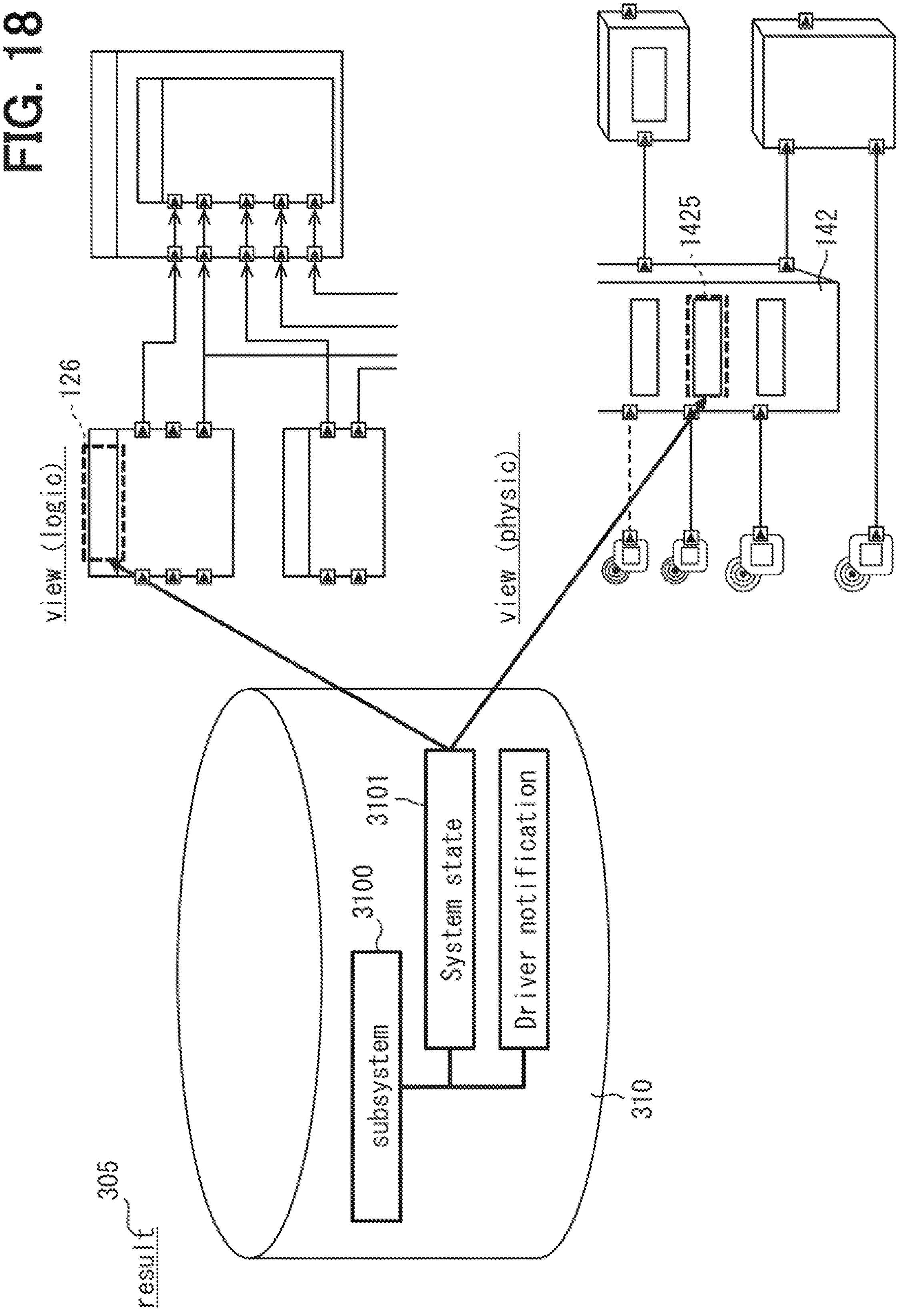
FIG. 18 is a diagram showing a relationship between a databases and a view.
Figure 20A:
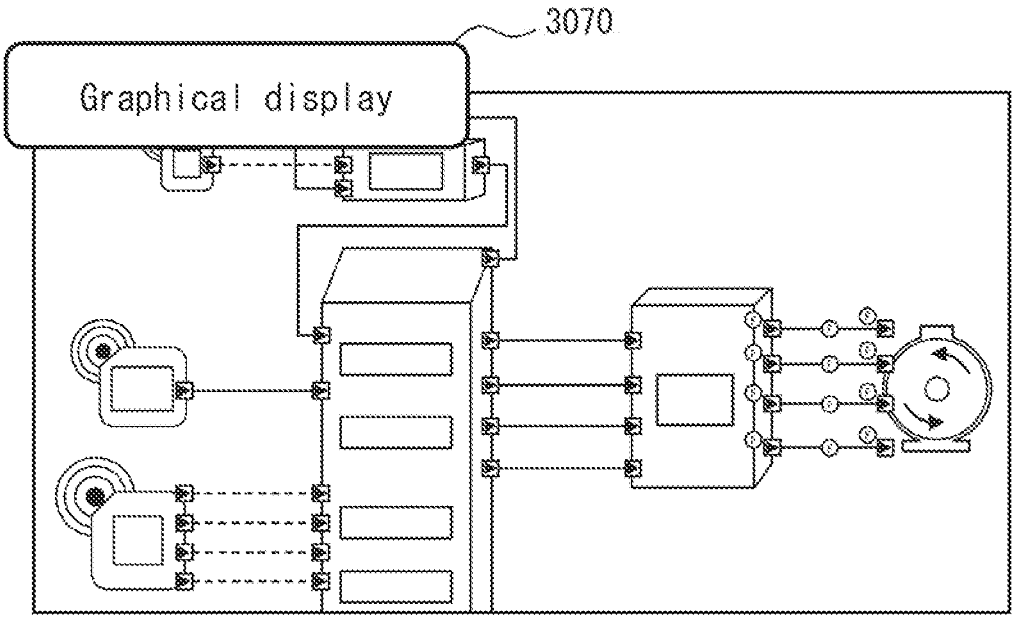
FIG. 20A to FIG. 20D are diagrams showing view examples.
Figure 20B:
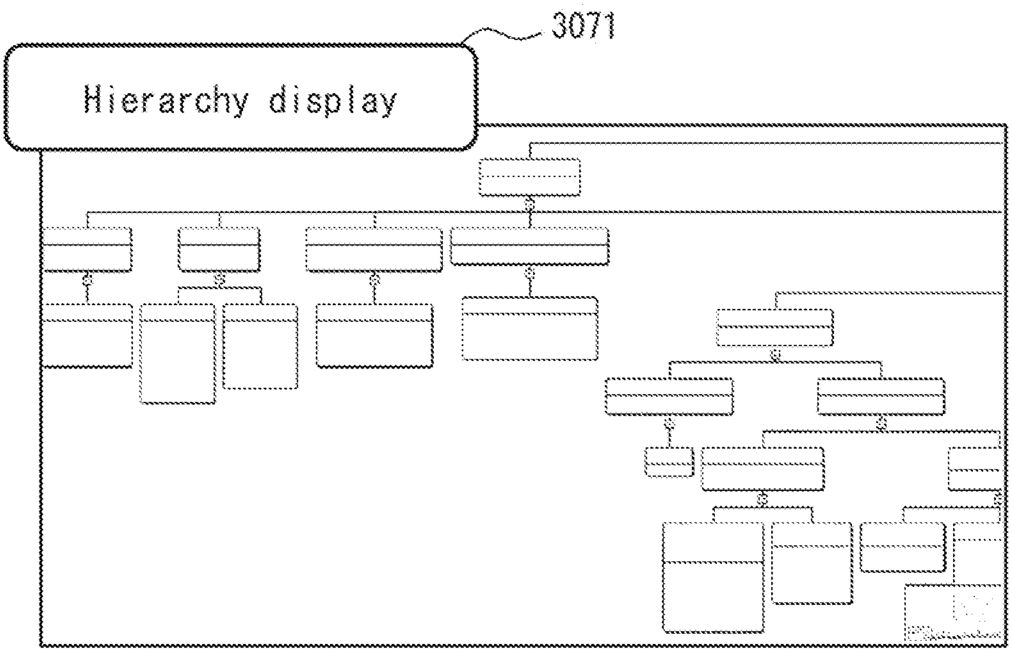
Figure 20C:
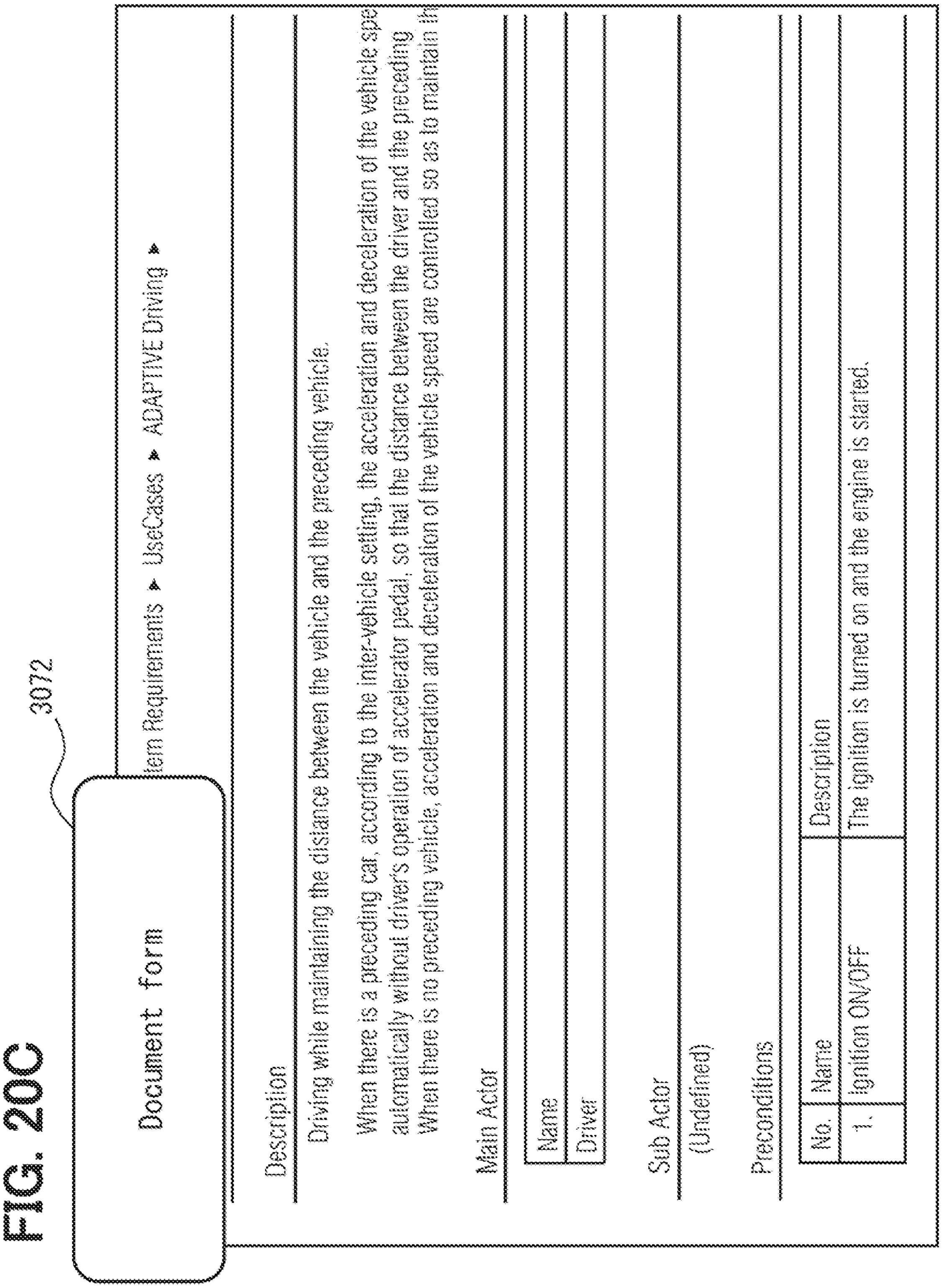
Figure 20D:
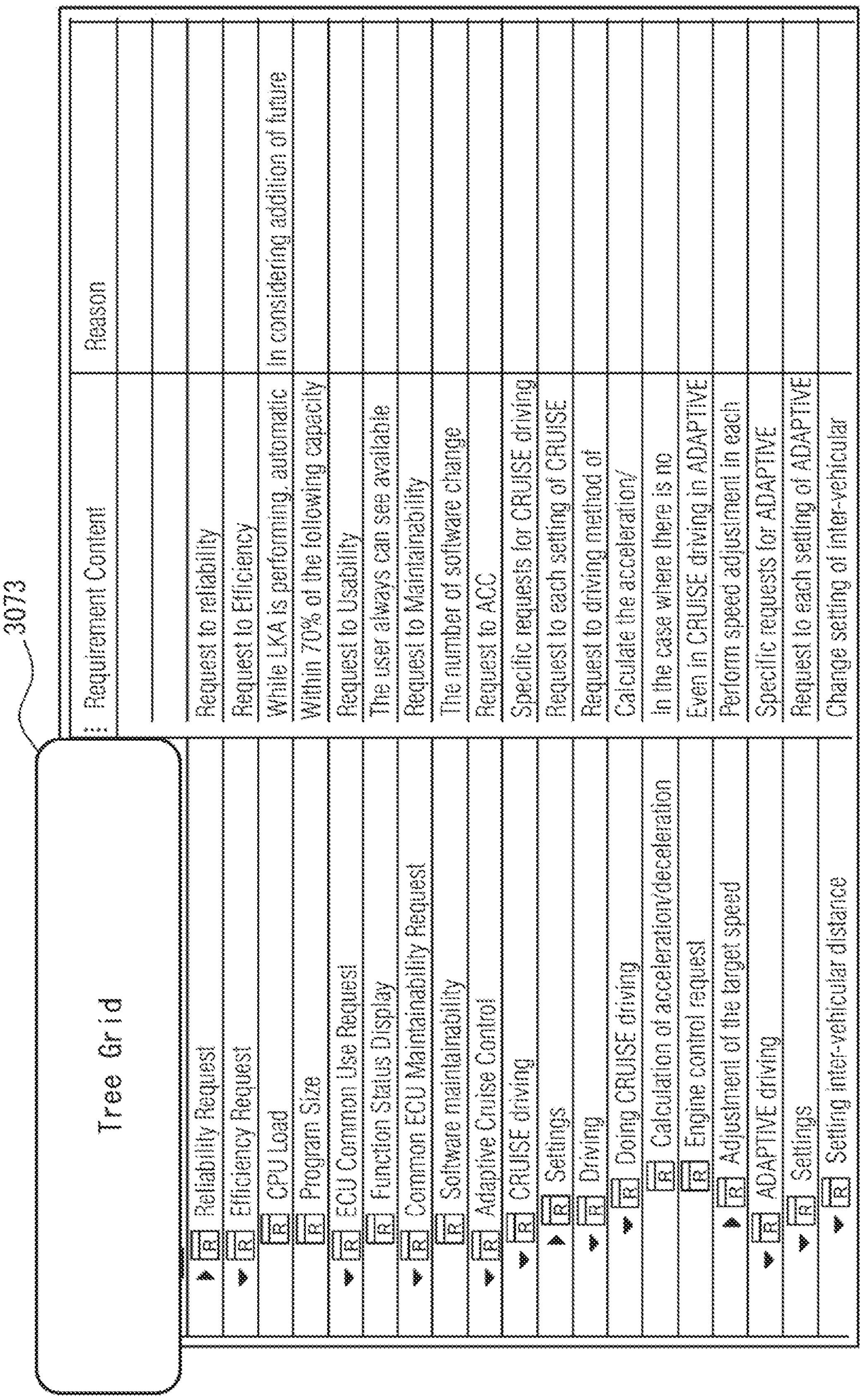

As described above, the design assistance tool of the present embodiment defines a series of development procedure from the requirement definition 110 of the system development 100 to the detail design 230 of the software development 200 using the metamodels 300, and proceeds the development design according to the contents defined in the metamodels 300. The information of the metamodels 300 and the design results 305 during the development period are recorded in one database 310 (FIG. 18). The databases 310 do not have to be physically configured as one database. Alternatively, the database 310 may be physically configured to be multiple divided databases.

For example, when a system state determination 3101 is written in a subsystem 3100 of the database 310 as the design result, as shown in FIG. 18, the system state determination 3101 can be displayed as the system state determination 126 of the logical design 120, and can be also displayed as the system state determination 1425 of the physical design 140.

Figure 27:
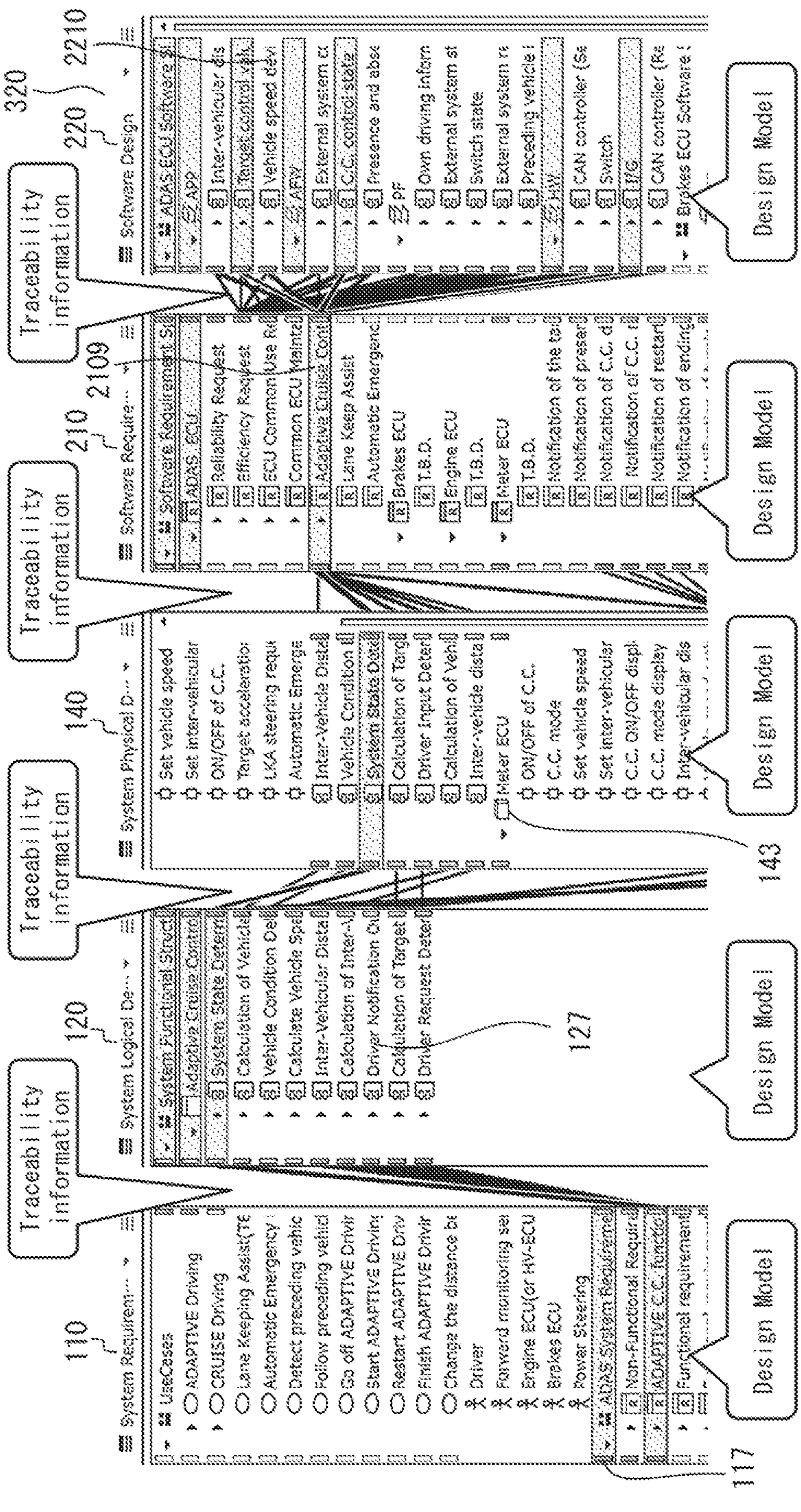
FIG. 27 is a diagram showing a derivation relationship.

As shown in FIG. 19, the design assistance tool of the present embodiment can display the design result 305 in different formats. In other words, the design assistance tool of the present embodiment can input design information from multiple screens. FIG. 19 shows the design result 305 of the software basic design 220, and a view 307 on the left side in FIG. 19 is an ER diagram, which is an entity-relationship diagram as shown in FIG. 14. The description content of the ER diagram can also be displayed in a table view 307 on the right side of the screen. The view 307 may be displayed on a liquid crystal display 320 (FIG. 27).

The table view 307 displays, as a responsibility of the layer APP 221, "target amount of acceleration/deceleration is calculated based on the difference between the speed and the inter-vehicular distance". The components 2202 include items of "1. inter-vehicular distance deviation 2211", "2. target control value 2212", and "3. vehicle speed deviation 2210", and also include responsibilities of the items 2202. The same applies to the layers 2201 below the AFW layer 222.

In both of the view 307 of the ER diagram and the view 307 of table format, the same information is stored in the database 310 although display is performed in different display modes.

The display mode of the view 307 used in the design assistance tool of the present embodiment is not limited to the ER diagram 3070 and a document form 3072 displayed in a table, and can also be displayed as a hierarchy diagram 3071 or a tree grid 3073 in concurrent manner as shown in FIG. 20A to FIG. 20D. The designer can appropriately select an easy-to-use format as the view 307 according to own design need. The ER diagram 3070 is suitable for an overview of the overall structure, and the table document form 3072 is suitable for defining the details of each item.

Although the four types of views 307 shown in FIG. 20A to FIG. 20D are examples that are easy to use for designing, the view 307 used in the design assistance tool of the present embodiment is not limited to the four types shown in FIG. 20A to FIG. 20D. On the contrary, it is possible to reduce the types of view 307 less than four types.

As described above, in the design assistance tool of the present embodiment, since the display of each view 307 simply changes the appearance of each component based on the data stored in the database 310, any view can be used. The input from any type of view 307 is processed as the same input in the database 310.

FIG. 21 shows an example of data structure stored in the database 310. For example, when defining the connection 148 between the output port 1405 of the ADAS ECU 142 and the input port 1404 of the meter ECU 143 in the physical design 140, the ID 1480 of the connection 148 itself, the ID 1481 of the connection source, and the ID of 1482 of the connection destination are specified in the database 310. Then, various data related to the connection 148 are stored. For example, the data related to the connection may include names, data itself, data versions, deletion information, and the like.

The information stored in the database 310 includes a relationship of the metaclasses 330. The connection 148 shown in FIG. 21 is the reference 302 relationship. As described above, since the relationship of the metaclasses 330 also includes the possession 301, the reference 302, the succession 303, and the derivation 304, all of these relationships are also stored in the database 310.

The information stored in the database 310 also includes a relationship between the metaclass 330 and the component of the design result 305 acquired based on the metaclass 330. The ID information of each component and the ID information of the metaclass 330 of the corresponding component are stored in the database 310.

The information stored in the database 310 also includes information related to the components of the design result 305. The metaclass 330 may correspond to multiple other components of the design result 305. In this case, not only the information between the metaclass 330 and the components but also the information between the components of the design result is stored in the database 310. The relationship of multiple components of the design result may be the possession or the reference.

As described above, in the design assistance tool of the present embodiment, the metamodel 300 can be defined by using the various views 307 shown in FIG. 20A to FIG. 20D, and the design can be performed in correspondence with the metamodel 300. Then, only by designing with any one view 307, the design result 305 can be displayed in all formats of the view 307 as shown in FIG. 20A to FIG. 20D.

When the design result 305 is changed in any one view 307, the changed result is automatically reflected in all formats of the corresponding view 307. Thus, the related design result 305 is always up-to-date, and there is no concern about update omission with the design assistance tool of the present embodiment.

In the example shown in FIG. 19, when a modification is made in the vehicle speed deviation 2210 of the APP layer 221 displayed on the left side of the figure, the modification is reflected in the document format, that is, in the responsibility and components of the APP layer 221 shown on the right side of the figure. In the example shown in FIG. 18, when a modification is made in the system state determination 126 of the logical design 120 of the system development, the modification is reflected in the system state determination 1425 of the ADAS ECU 142 of the physical design 140 of the system development.

As described above, in the design assistance tool of the present embodiment, the metamodel 300 and the design result 305 can be freely modified in each design process without being restricted by a specific rule. Thus, it is possible to perform detailed design by performing examination in each component only by defining a rough design procedure of top-down development. Thus, the design assistance tool is suitable for the large-scale system development.

The design assistance tool of the present embodiment is also suitable for the bottom-up development because the metamodel 300 and the design result 305 can be rewritten in each design process when a high-level design is performed using the component designed in detail in a low-level design.

The definition made in top-down development can be modified in the lower process. Thus, an inconsistency may occur between the upper process and the lower process, or an inconsistency may occur between two components in the same level process. In the bottom-up development, in the upper process, it may be necessary to make different definition for the metamodel 300 and the design result 305 from that made in the lower process.

Figure 22:
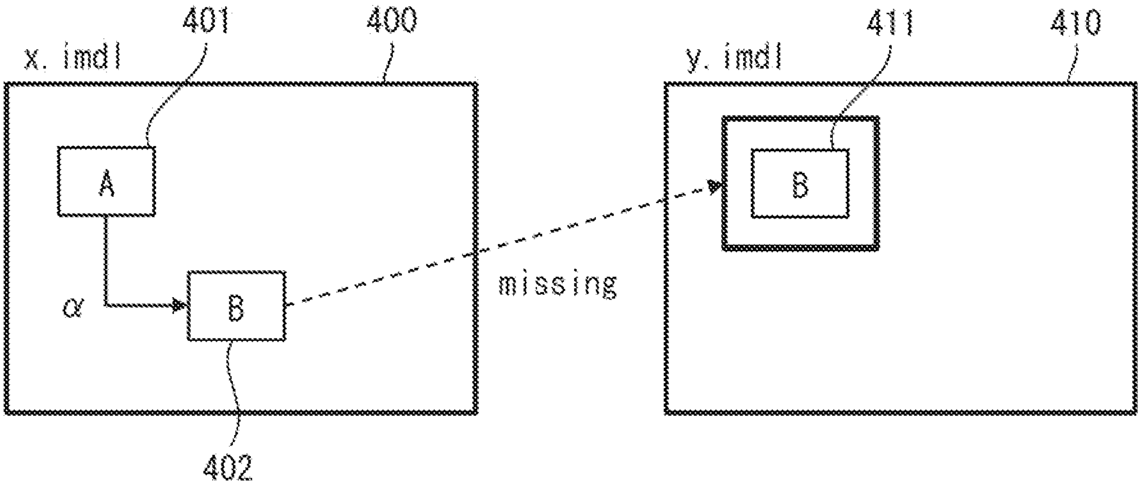
FIG. 22 is a diagram showing an inconsistency occurred in the design results.

For example, as shown in FIG. 22, the component A 401 and the component B 402 are used in X design result 400. When the component B 402 refers to the component B 411 of Y design result 410 in a state where the component B 411 in Y design result 410 has been deleted, an inconsistency occurs between the X design result 400 and the Y design result 410.

Figure 23:
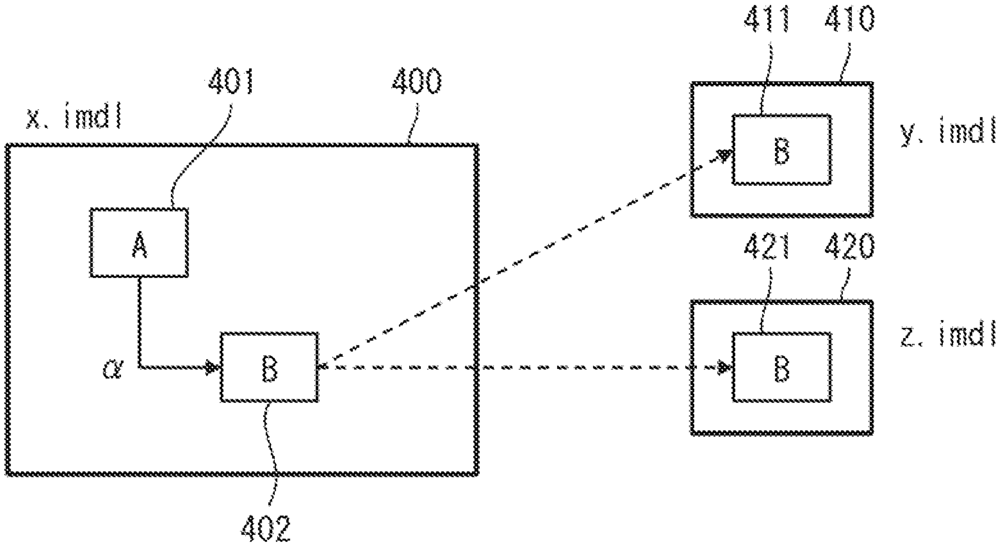
FIG. 23 is a diagram showing an inconsistency occurred in the design results.

AS another example, as shown in FIG. 23, when the component A 401 and the component B 402 are used in the X design result 400 and the component B 402 refers to the component B 411 of the Y design result 410 under a state that the same component B is also defined as the component B 421 in the Z design result 420, an inconsistency may occur between the component B 411 of the Y design result 410 and component B 421 of the Z design result 420.

Figure 24:
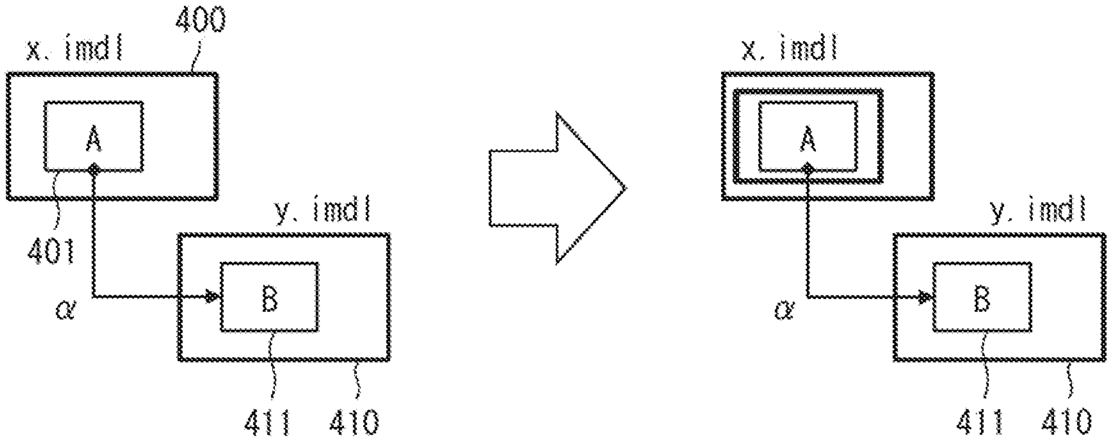
FIG. 24 is a diagram showing an inconsistency occurred in the design results.

As another example, as shown in FIG. 24, the component A 401 of the X design result 400 may be deleted in a state where the component B 411 of the Y design result 410 refers to the component A 401 of the X design result 400. In this case, an inconsistency occurs since an actual body of the design result 305 to be referred is deleted.

Figure 25:
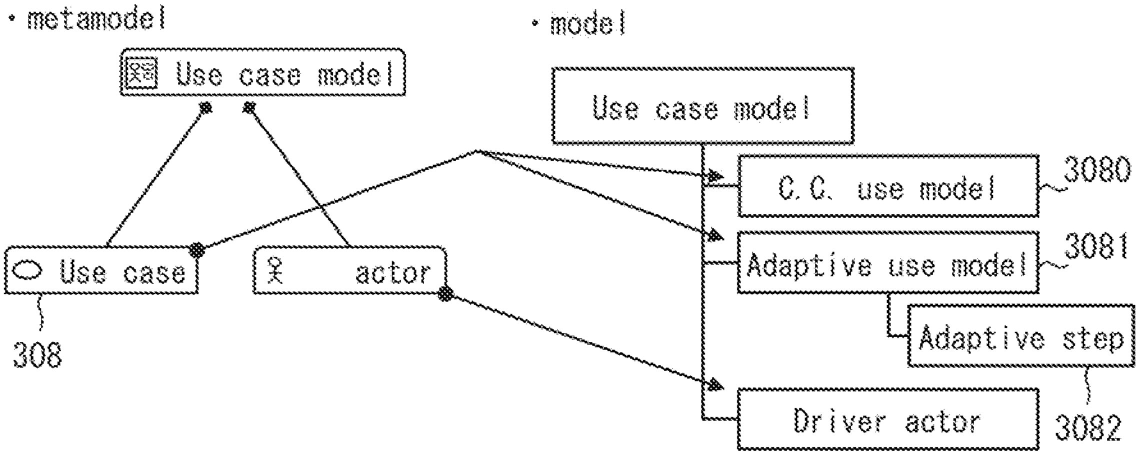
FIG. 25 is a diagram showing an inconsistency between a metamodel and a design result.

As another example, as shown in FIG. 25, there may exist a part that is not included in the metamodel 300. In the example shown in FIG. 25, the use case 308 corresponds to the cruise control use model 3080 and the adaptive use model 3081. However, when an adaptive step 3082 is further added to the adaptive use model 3081, an inconsistency may occur between the metamodel 300 and the design result 305.

Since the design assistance tool of the present embodiment can be corrected at each design process as described above, occurrence of such inconsistencies are set to be permissible. By allowing these inconsistencies, it is possible to give flexibility to the design assistance tool, and the designer can continue the design work without stress.

Instead of allowing inconsistencies, the design assistance tool of the present embodiment may detect inconsistencies and notify the designer of the detected inconsistencies. With this configuration, the designer can easily correct the metamodel 300 and design result 305 corresponding to the metamodel 300 to have the consistency. Inconsistency detection may be performed when the file is opened or when the metamodel 300 is modified by deleting, editing, or merging.

In the example shown in FIG. 22, when the inconsistency is detected, a message, such as "deleted model is found." can be displayed on the display 320 (FIG. 27). At the same time, the file name of the X design result 400, the class name of the component A 401 that is the connection source, the relationship name of the relationship a 403, and a collection index number of the component B 402 which indicates the order of the metamodel in the collection may be displayed together with the message.

As described above, the database 310 stores the metaclass 330, the corresponding component A 401, and the corresponding component B 402. In the database 310, the component A 401 and the component B 402 are stored in the reference relationship. Thus, when the component B 402 is deleted, an inconsistency in the reference relationship can be detected.

When the designer sees such a display, the designer can correct the inconsistency by using the editor function, which is normally used for design purpose, without using a dedicated inconsistency correction function. For example, when the component B 411 is deleted from the Y design result 410, the inconsistency can be solved by using the Y design result 410 before the deletion of component B 411.

In the example shown in FIG. 23, when the inconsistency is detected, a message such as "a duplicate model is found in another file" can be displayed on the display 320. At the same time, the component B 411 of the Y design result 410 and the component B 421 of the Z design result 420, and the information related to the component B 421 may be displayed together with the message.

The database 310 stores the component B 402 of the X design result 400 and the component B 411 of the Y design result 410, and also stores the reference relationship together with the respective ID information of the components. The database 310 also stores the respective ID information of the component B 402 of the X design result 400 and the component B 421 of the Z design result 420, and stores the reference relationship therebetween. Thus, the database 310 can detect the inconsistency in the reference relationship between the two components.

In this example, the designer does not need to use the dedicated inconsistency correction function for correct the inconsistency as described above. For example, the component B 411 found first can be used, and the component B 421 found later can be skipped.

When the designer corrects the inconsistency, the component B 411 found first may be deleted and the component B 421 found later may be adopted by using the normal editor function. Alternatively, it is also possible to delete the component B 421 found later.

The same applies to the example shown in FIG. 24. In response to detection of the inconsistency, the design assistance tool of the present embodiment may output a message "a model with no parent has been found" on the display 320, and display the file name of the X design result 400 and the class name of the relationship a 403.

In the example of FIG. 24, the design assistance tool of the present embodiment has the same operation as a case where only the Y design result 410 is read. Thus, no special inconsistency correction function is provided. In order to correct the detected inconsistency, the designer can move the X design result 400 to an appropriate position or cancel the deletion of the X design result 400 by using a normal design function.

In each example of FIG. 22, FIG. 23, and FIG. 24, an error message may be displayed in response to an operation that causes the inconsistency being performed. For example, in the example of FIG. 24, the design assistance tool may display an error message when the X design result 400 is deleted.

In the above examples, the relationship between the components of the design result 305 is the reference relationship. For the possession relationship, the inconsistency can be detected in the same manner. The database 310 stores references relationship and possession relationship as relationship information between the components of the design result 305.

In the example of FIG. 25, in response to the detection of inconsistency, the design assistance tool of the present embodiment may output a message such as "a model with no metamodel is found" to the display 320, and displays the model file name of the metamodel 300 and the model name of the adaptive step 3082, which has no metamodel and corresponds to the use case 308.

The database 310 stores the relationship between the metaclass 330 of the use case 308 and the components of the design result 305. When the adaptive step 3082 is added as a component, the adaptive step 3082 has a relationship that is not included in the metaclass 330. Thus, the inconsistency can be detected.

The same applies to the example shown in FIG. 25. The design assistance tool of the present embodiment does not provide a special inconsistency correction function in this case. The designer can correct the inconsistency by deleting the adaptive step 3082 using a normal editor function.

The design assistance tool of the present embodiment can display the above error message because the database 310 stores the possession 301 relationship and the reference 302 relationship as relationship information. Each of the possession 301 and the reference 302 defines the relationship between two different metaclasses 330.

The components of design result 305 in each step is set to have a relationship with the metaclass 330. Thus, the components of design result 305 also have the possession 301 and the reference 302 as relationship information.

The possession 301 and the reference 302 are also stored in the database 310 as relationship information between two components of the design result 305. Thus, when a contradiction occurs between the component of the design result 305 and the metaclass 330, or between two components of the design result, the database 310 can detect the contradiction.

The design assistance tool of the present embodiment automatically ensures traceability. The top-down development is easy to understand. In the development from the requirement definition 110 of the system development 100 to the detail design 230 of the software development 200, consistency is required between the upper process and the lower process. The "traceability management" is to centrally manage the relationship of work products (components) between the upper and lower processes, and to quickly trace the source of problem when a problem occurs in the design, manufacturing, or maintenance.

In the design assistance tool of the present embodiment, the design information from the upper process to the lower process is defined by the derivation 304 in the metamodel 300. Thus, the metamodel 300 in the lower process can be created in association with the metamodel 300 defined in the upper process. On the contrary, it is also possible to create the metamodel 300 in the upper process in association with the metamodel 300 defined in the lower process.

Figure 26:
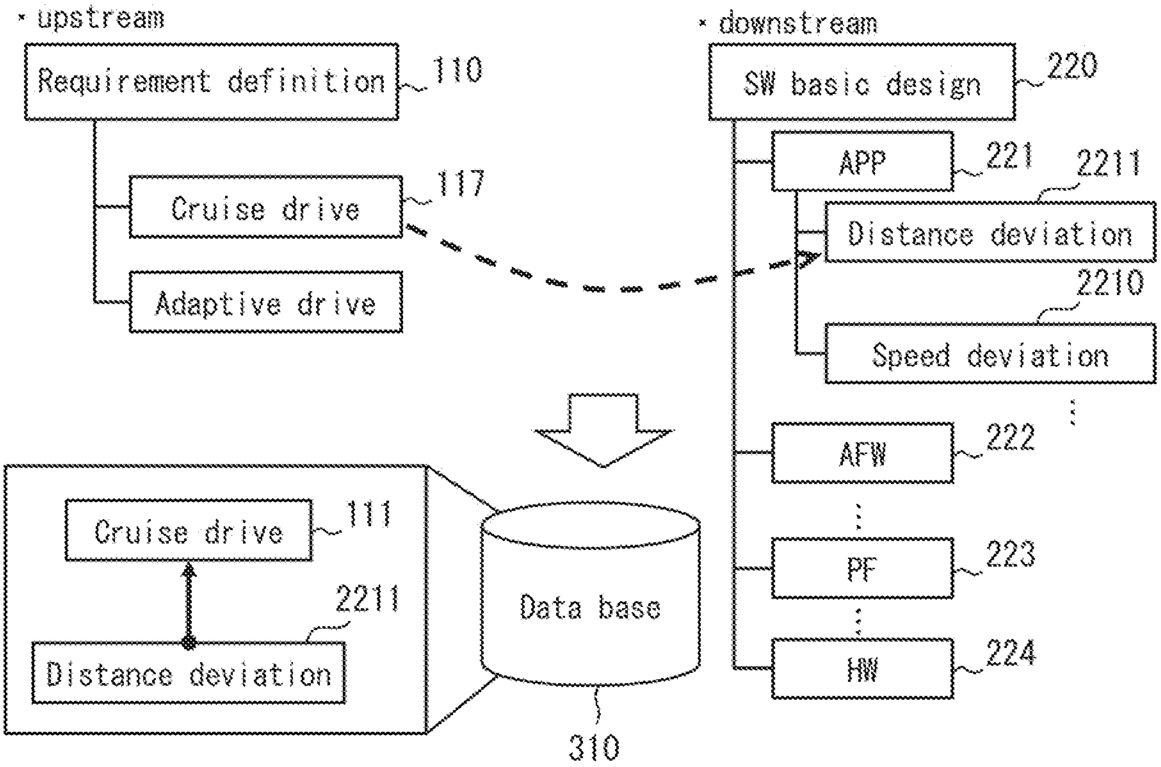
FIG. 26 is a diagram showing a derivation relationship.

FIG. 26 is a diagram showing an operation of the derivation 304 on the display 320. As shown in the figure, the display 320 can display the requirement definition 110 of the upper process on the left side, and display the software basic design 220 of the lower process on the right side. In a case where the designer designs the inter-vehicular distance deviation component 2211 in the APP layer 221 of the software basic design 220 on the right side, the designer may drag, using the mouse, the cruise drive 117 on the left side to a location of the inter-vehicular distance deviation component 2211. By this simple drag operation, the inter-vehicular distance deviation component 2211 can be derived from the cruise drive 117.

An operation example is described as above. When the designer operates the metamodel 300 positioned on the left side or right side of the screen to set the relationship as described above, the set derivation 304 relationship is stored in the database 310. That is, the database 310 automatically stores the designer's operation to set the derivation relationship as trace information.

That is, the database 310 automatically stores the relationship between the inter-vehicular distance deviation component 2211 and the cruise drive 117 as the derivation 304 relationship. More specifically, the operation time information of the derivation 304 relationship setting is stored in the database 310. The database 310 stores the derivation 304 relationship, the ID information of the derivation destination, and the ID information of the derivation source. Thus, the relationship information of derivation 304 can be used as trace information.

In the design assistance tool of the present embodiment, the designer can intuitively grasp the relationship of the derivation 304 by connecting the relationship with a line. In FIG. 27, the requirement definition 110, the logical design 120 and the physical design of the system development 100, and the software specification definition 210 and the software basic design are displayed on the display 320 side by side, and the derivation 304 relationship is connected by a line.

For example, the cruise drive 117 of the requirement definition 110, the driver notification output 127 of the logical design 120, the meter ECU 143 of the physical design 140, the adaptive cruise control 2109 of the software specification definition 210, and the vehicle speed deviation 2210 of the basic design 220 have derivation 304 relationship. Therefore, trace information can be obtained by tracing the line indicating the derivation relationship.

As described above, in the design assistance tool of the present embodiment, the metamodel 300 is defined in each process of design, and the design is performed according to the definition of metamodel. Then, the derivation 304 relationship between the component of the upper process and the component of the lower process is stored in the database 310. Thus, by using the design assistance tool of the present embodiment, the designer can intuitively grasp whether all of the requirements defined in the upper process are included in the functions of the lower process. Further, it is possible to confirm whether a function that is not required in the upper process is created in the lower process. Thus, when making a design modification, it is possible to grasp a range that may be affected by the design modification.

The design assistance tool according to the present disclosure enables a flexible modification of definitions of the metamodel and components of the metamodel without being restricted by predetermined rules. Further, the design assistance tool according to the present disclosure enables an easy correction of inconsistencies, which are occurred in the entire system due to the modification.

The above-described autonomous driving system of vehicle is an application example. The design assistance tool of the present disclosure may be used in other system developments. The display 320 usually adopts a liquid crystal screen of a computer. Alternatively, instead of the display 320, a paper may be used by printing out the displayed contents. The designer usually operates the design assistance tool using a mouse or a keyboard. Alternatively, information may also be input by image recognition or voice recognition. The design assistance tool may be operated by inputting the information, via another device to which the information is directed input.

The design mode of the system development 100 is defined to include the requirement definition 110, the logical design 120, the control design 130, and the physical design 140. The design mode of the software development 200 is defined to include the specification definition 210, the basic design 220, and the detail design 230. Although these design modes are commonly used, the design modes are not limited to the above-described examples. Alternatively, different design modes can be adopted. With the design assistance tool of the present embodiment, the consistency of the design contents can be grasped, and the characteristics of the design assistance tool are not changed by the name of each process.

In the present disclosure, the relationship between the metaclasses 330 of the metamodel 300 include the possession 301, the reference 302, the succession 303, and the derivation 304. Alternatively, only a part of the above-described relationships can be adopted in actual design work. Alternatively, different relationships can be added to the above-described relationships. The design assistance tool of the present embodiment requires at least one of the possession 301 or the reference 302 as the relationship.

The present disclosure can be used as a design assistance tool, and can also be used for process design when developing a large-scale system such as an autonomous driving system for vehicles.

The present disclosure can be provided as a design assistance method. A design assistance method, which assists a design of at least one process, includes: defining a metamodel using two or more metaclasses in the at least one process and performing a design of the at least one process using the metamodel; defining a relationship between the two or more metaclasses of the metamodel as a possession relationship or a reference relationship; displaying a design result of the at least one process as a view on a display; and in response to an occurrence of an inconsistency in the possession relationship or the reference relationship of the two or more metaclasses due to creation, modification, or deletion of one of the two or more metaclasses, allowing the inconsistency and displaying the inconsistency on the view of the display.

A design assistance method, which assists a design of at least two processes, includes: defining a metamodel using one or more metaclass in each of the at least two processes and performing a design of each of the at least two processes using the corresponding metamodel; defining a relationship between one metaclass included in one of the at least two processes and one metaclass included in another one of the at least two processes as a possession relationship or a reference relationship; displaying a design result based on the metamodels as a view on a display; and in response to an occurrence of an inconsistency in the possession relationship or the reference relationship between the one metaclass included in one of the at least two processes and the one metaclass included in another one of the at least two processes due to creation, modification, or deletion of one metaclass in any one of the at least two processes, allowing the inconsistency and displaying the inconsistency on the view of the display.

A design assistance method, which assists a design of at least one process, includes: defining a metamodel using one or more metaclass in each of the at least two processes and performing a design of each of the at least two processes using the corresponding metamodel; defining a relationship between two or more components, which correspond to a design result based on the metamodel, as a possession relationship or a reference relationship; displaying the design result as a view on a display; and in response to an occurrence of an inconsistency in one of the two or more components, which correspond to the design result, due to creation, modification, or deletion of another one of the two or more components, allowing the inconsistency and displaying the inconsistency on the view of the display.

Although the present disclosure has been described in accordance with foregoing embodiments, it is understood that the present disclosure is not limited to such embodiments or structures. The present disclosure also includes various modification examples or variations within the scope of equivalents. In addition, various combinations and configurations, as well as other combinations and configurations that include only one element, more, or less, are within the scope and spirit of the present disclosure.

What is claimed is:

1. A design assistance tool device assisting a design of at least two processes, the design assistance tool device comprising:

a display device;

a microcomputer;

a computer-readable non-transitory storage medium storing a program that, when executed by the microcomputer, configures the microcomputer to:

define a metamodel using one or more metaclass in each of the at least two processes and perform a design of each of the at least two processes using the corresponding metamodel;

define a relationship between one metaclass included in one of the at least two processes and one metaclass included in another one of the at least two processes as a possession relationship or a reference relationship;

display a design result based on the metamodels as a view on the display device; and in response to an occurrence of an inconsistency in the possession relationship or the reference relationship between the one metaclass included in one of the at least two processes and the one metaclass included in another one of the at least two processes due to creation, modification, or deletion of one metaclass in any one of the at least two processes, allow the inconsistency without restricting the creation, modification, or deletion of one metaclass under predetermined rules defined in the metamodel and display the inconsistency on the view of the display device;

wherein:

the design assistance tool device is configured to design a vehicle system, the design of the vehicle system including a system development process and a software development process;

the system development process includes, as the at least two processes:

a requirement definition process that sets a development goal;

a logical design process that defines a function, an input, and an output;

a control design process that defines a calculation formula to be used for each control as a circuit design; and a physical design process that physically assigns a control to a vehicle electronic control unit (ECU);

the software development process includes, as the at least two processes:

a specification definition process that defines specification of a software that concretely includes an outline defined in the system development:

a basic design process that divides functions defined in the system development into multiple layers and defines, for each function, an input to be obtained and an output to be output; and a detail design process that defines a specific calculation method in a flowchart and describes the calculation method with a programming language;

in the system development process, each of the requirement definition process, the logical design process, the control design process, and the physical design process is performed using the corresponding metamodel; and in the software development process each of the specification definition process, the basic design process, and the detail design process is performed using the corresponding metamodel.

2. The design assistance tool device according to claim 1, wherein:

in response to receiving an operation made by a designer, the creation, modification, or deletion of one metaclass is performed in the view of the display device.

3. The design assistance tool device according to claim 1, wherein:

in response to receiving an operation made by a designer related to the creation, modification, or deletion of one metaclass, the creation, modification, or deletion of one metaclass is reflected in the view of the display device.

4. The design assistance tool device according to claim 1, wherein the program, when executed by the microcomputer, further configures the microcomputer to execute the system development process and the software development process using the ECU in a repeated manner by performing, when design content is expressed from another viewpoint, a definition of logical formula and an arrangement design for physically arranging the design content in both of the system development and the software development.

5. A design assistance method assisting a design of at least two processes, the design assistance method comprising:

defining, with a microcomputer of a design assistance tool device, a metamodel using one or more metaclass in each of the at least two processes and performing, with the microcomputer, a design of each of the at least two processes using the corresponding metamodel;

defining, with the microcomputer, a relationship between one metaclass included in one of the at least two processes and one metaclass included in another one of the at least two processes as a possession relationship or a reference relationship;

displaying, with the microcomputer, a design result based on the metamodels as a view on a display device of the design assistance tool device; and in response to an occurrence of an inconsistency in the possession relationship or the reference relationship between the one metaclass included in one of the at least two processes and the one metaclass included in another one of the at least two processes due to creation, modification, or deletion of one metaclass in any one of the at least two processes, allowing, with the microcomputer, the inconsistency without restricting the creation, modification, or deletion of one metaclass under predetermined rules defined in the metamodel and displaying, with the microcomputer, the inconsistency on the view of the display device;

designing, with the design assistance tool device, a vehicle system, the design of the vehicle system including a system development process and a software development process;

wherein:

the system development process includes, as the at least two processes:

a requirement definition process that sets a development goal;

a logical design process that defines a function, an input, and an output;

a control design process that defines a calculation formula to be used for each control as a circuit design; and a physical design process that physically assigns a control to a vehicle electronic control unit (ECU);

the software development process includes, as the at least two processes:

a specification definition process that defines specification of a software that concretely includes an outline defined in the system development;

a basic design process that divides functions defined in the system development into multiple layers and defines, for each function, an input to be obtained and an output to be output; and a detail design process that defines a specific calculation method in a flowchart and describes the calculation method with a programming language;

in the system development process, each of the requirement definition process, the logical design process, the control design process, and the physical design process is performed using the corresponding metamodel; and in the software development process each of the specification definition process, the basic design process, and the detail design process is performed using the corresponding metamodel.

6. The design assistance method according to claim 5, wherein:

in response to receiving an operation made by a designer, the creation, modification, or deletion of one metaclass is performed in the view of the display device.

7. The design assistance method according to claim 5, wherein:

in response to receiving an operation made by a designer related to the creation, modification, or deletion of one metaclass, the creation, modification, or deletion of one metaclass is reflected in the view of the display device.

8. The design assistance method according to claim 5, further comprising:

executing, with the microcomputer the system development process and the software development process using the ECU in a repeated manner by performing, when design content is expressed from another viewpoint, a definition of logical formula and an arrangement design for physically arranging the design content in both of the system development and the software development.

* * * * *